United States Patent
Mori (12)

(10) Patent No.: US 11,043,930 B2
(45) Date of Patent: Jun. 22, 2021

(54) RADIO FREQUENCY CIRCUIT, RADIO FREQUENCY FRONT END CIRCUIT, AND COMMUNICATION APPARATUS

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/879,165

(22) Filed: May 20, 2020

(65) Prior Publication Data

US 2020/0280296 A1 Sep. 3, 2020

Related U.S. Application Data

(63) Continuation of application No. PCT/JP2018/041271, filed on Nov. 7, 2018.

(30) Foreign Application Priority Data

Nov. 24, 2017 (JP) .............................. JP2017-225872

(51) Int. Cl.
*H04B 1/38* (2015.01)
*H03H 7/03* (2006.01)
(Continued)

(52) U.S. Cl.
CPC ............ *H03H 7/03* (2013.01); *H03H 7/0115* (2013.01); *H03H 7/461* (2013.01); *H04B 1/40* (2013.01)

(58) Field of Classification Search
CPC ........ H03H 7/03; H03H 7/0115; H03H 7/461; H04B 1/04; H04B 1/40; H04B 1/48
See application file for complete search history.

(56) References Cited

U.S. PATENT DOCUMENTS

| 9,124,355 B2 * | 9/2015 | Black ..................... H04B 1/525 |
| 2013/0241669 A1 * | 9/2013 | Mikhemar ............... H04B 1/52 |
| | | 333/126 |

(Continued)

FOREIGN PATENT DOCUMENTS

| JP | 2006128881 A | 5/2006 |
| JP | 2014112769 A | 6/2014 |

(Continued)

OTHER PUBLICATIONS

International Search Report issued in Application No. PCT/JP2018/041271, dated Feb. 5, 2019.

(Continued)

*Primary Examiner* — Tuan Pham
(74) *Attorney, Agent, or Firm* — Pearne & Gordon LLP

(57) ABSTRACT

A radio frequency circuit includes a filter of a Band A, a filter of a Band B, a filter of a Band C, a low pass filter that is connected between a common terminal and a first terminal, a high pass filter that is connected between the common terminal and a second terminal, and an impedance variable circuit. The frequency interval between the Band A and the Band B is smaller than the frequency interval between the Band A and the Band C. In CA of the Band A and the Band B, the filter is connected to the first terminal, the filter is connected to the second terminal, and an impedance of the low pass filter when viewed from the first terminal and an impedance of the high pass filter when viewed from the second terminal have a complex conjugate relationship.

12 Claims, 24 Drawing Sheets

(51) Int. Cl.
*H03H 7/01* (2006.01)
*H03H 7/46* (2006.01)
*H04B 1/40* (2015.01)

(56) References Cited

U.S. PATENT DOCUMENTS

2018/0070364 A1* 3/2018 Varanese ............ H04W 72/046
2018/0343000 A1 11/2018 Nosaka

FOREIGN PATENT DOCUMENTS

JP 2014216711 A 11/2014
WO 2017138539 A1 8/2017

OTHER PUBLICATIONS

Written Opinion issued in Application No. PCT/JP2018/041271, dated Feb. 5, 2019.

* cited by examiner

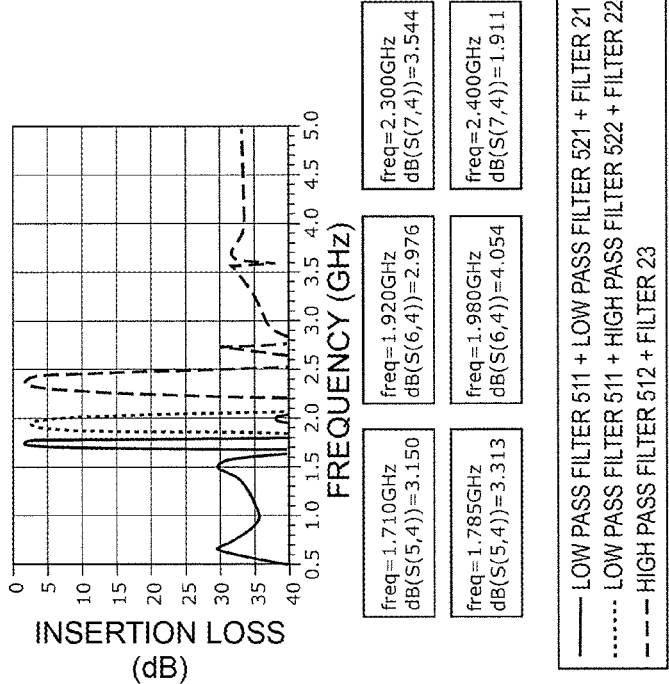
FIG. 4BA
FIG. 4BB
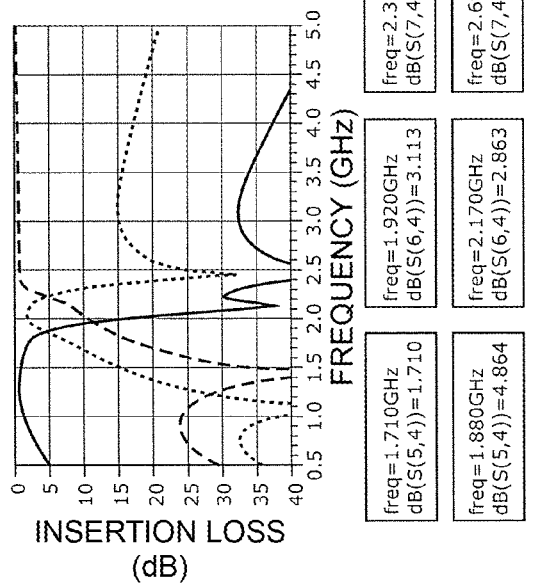

RADIO FREQUENCY CIRCUIT, RADIO FREQUENCY FRONT END CIRCUIT, AND COMMUNICATION APPARATUS

This is a continuation of International Application No. PCT/JP2018/041271 filed on Nov. 7, 2018 which claims priority from Japanese Patent Application No. 2017-225872 filed on Nov. 24, 2017. The contents of these applications are incorporated herein by reference in their entireties.

BACKGROUND

Technical Field

The present disclosure relates to a radio frequency circuit, a radio frequency front end circuit, and a communication apparatus.

In recent years, mobile communication terminals have been demanded, as a single terminal, to support a plurality of frequency bands, so-called multiple bands, and a front end circuit arranged between an antenna element and an amplifier has also been demanded to support multiple bands. In accordance with this, in the front end circuit, to ensure the signal quality of each frequency band, a diplexer is arranged between an antenna element and a filter corresponding to the frequency band.

A circuit configuration of a diplexer that includes a low pass filter and a high pass filter that are connected to a common terminal is disclosed in Patent Document 1. At least one of the low pass filter and the high pass filter includes an LC parallel resonant circuit. Accordingly, compared to a diplexer that divides a signal only using a notch circuit, a pass band can be widened.

Patent Document 1: Japanese Unexamined Patent Application Publication No. 2006-128881

BRIEF SUMMARY

In a radio frequency circuit that includes the above-mentioned conventional diplexer and a plurality of filters connected to the diplexer and having different pass bands, carrier aggregation (CA) in which radio frequency signals of two pass bands are transmitted at the same time using two filters can be executed. In this case, an overlapping frequency band in which a transition band where transition from a pass band to an attenuation band of a low pass filter occurs and a transition band where transition from a pass band to an attenuation band of a high pass filter occurs overlap is set in a boundary frequency band between the two pass bands. Accordingly, isolation between radio frequency signals of the two pass bands can be ensured.

However, for example, in the case where a boundary frequency band is narrow, as with pass bands of two filters belonging to the same frequency band group (a low band group or a high band group), the two pass bands are close to the overlapping frequency band. The overlapping frequency band is located between a high frequency end of the pass band of the low pass filter in which insertion loss is degraded and a low frequency end of the pass band of the high pass filter in which insertion loss is degraded. Therefore, there is a problem of degradation in the insertion loss of the radio frequency circuit in the two pass bands mentioned above, which are close to the overlapping frequency band.

The present disclosure provides a radio frequency circuit, a radio frequency front end circuit, and a communication apparatus in which degradation in insertion loss is reduced even in the case where CA is executed between two pass bands with a narrow frequency interval.

A radio frequency circuit according to an aspect of the present disclosure is able to transmit a radio frequency signal of a first pass band and a radio frequency signal of a second pass band at the same time and transmit a radio frequency signal of the first pass band and a radio frequency signal of a third pass band that is located between the first pass band and the second pass band at the same time, includes a common terminal; a first terminal; a second terminal; a first filter having the first pass band; a second filter having the second pass band; a third filter having the third pass band; a diplexer that includes a low pass filter connected between the common terminal and the first terminal, allowing a radio frequency signal within a first frequency band to pass through, and attenuating a radio frequency signal within a second frequency band and a high pass filter connected between the common terminal and the second terminal, allowing a radio frequency signal within a third frequency band to pass through, and attenuating a radio frequency signal within a fourth frequency band; and a first impedance variable circuit that is connected to at least one of the low pass filter and the high pass filter. The first impedance variable circuit includes a first impedance element, and a first switch element connected to the first impedance element. A boundary frequency width between the first pass band and the third pass band is smaller than a boundary frequency width between the first pass band and the second pass band. An overlapping frequency band in which a first transition band in which transition from the first frequency band to the second frequency band occurs and a second transition band in which transition from the third frequency band to the fourth frequency band occurs overlap is located between the first pass band and the third pass band. In a case where a radio frequency signal of the first pass band and a radio frequency signal of the third pass band are transmitted at the same time, the first filter is directly or indirectly connected to one of the first terminal and the second terminal, the third filter is directly or indirectly connected to the other one of the first terminal and the second terminal, and according to a conduction state or a non-conduction state of the first switch element, an impedance of the low pass filter when viewed toward the common terminal from the first terminal and an impedance of the high pass filter when viewed toward the common terminal from the second terminal have a complex conjugate relationship.

A boundary frequency width between two pass bands that are used at the same time is different between a case (1) where the first pass band and the second pass band are used at the same time and a case (2) where the first pass band and the third pass band are used at the same time. If the boundary frequency width is narrow, the two pass bands are close to the overlapping frequency band that is located between a high frequency end of the pass band of the low pass filter where insertion loss is degraded and a low frequency end of the pass band of the high pass filter where insertion loss is degraded. Therefore, there is a problem of degradation in the insertion loss of the radio frequency circuit in the two pass bands.

With the above configuration, in the case where the first pass band and the third pass band for which the boundary frequency width is narrow are used at the same time, an impedance of the low pass filter when the common terminal side is viewed from the first terminal and an impedance of the high pass filter when the common terminal side is viewed from the second terminal have a complex conjugate relationship, according to the conduction state or the non-conduction state of the first switch element. Therefore, complex conjugate matching between the low pass filter and the high pass filter can be achieved. Thus, degradation in the insertion loss in the pass band of the radio frequency circuit in the case where the first pass band and the third pass band are used at the same time can be reduced.

Consequently, in the radio frequency circuit that executes CA of two frequency bands with a narrow frequency interval, degradation in the insertion loss can be reduced.

Furthermore, according to the conduction state or the non-conduction state of the first switch element, an impedance in the first pass band of the low pass filter when viewed toward the common terminal from the first terminal and an impedance in the third pass band of the high pass filter when viewed toward the common terminal from the second terminal may have a complex conjugate relationship, and an impedance in the third pass band of the low pass filter when viewed toward the common terminal from the first terminal and an impedance in the first pass band of the high pass filter when viewed toward the common terminal from the second terminal may have a complex conjugate relationship.

Accordingly, the impedance of the low pass filter when the common terminal side is viewed from the first terminal and the impedance of the high pass filter when the common terminal side is viewed from the second terminal have a complex conjugate relationship both in the pass band and the attenuation band. Therefore, complex conjugate matching between the low pass filter and the high pass filter can be achieved with high accuracy. Thus, degradation in the insertion loss in the pass band of the radio frequency circuit in the case where the first pass band and the third pass band are used at the same time can be reduced.

Furthermore, in a case where a radio frequency signal of the first pass band and a radio frequency signal of the third pass band are transmitted at the same time, the first switch element may be in the conduction state. In a case where a radio frequency signal of the first pass band and a radio frequency signal of the third pass band are transmitted exclusively from each other, the first switch element may be in the non-conduction state.

With this configuration, in the case where the first pass band and the third pass band for which the boundary frequency width is narrow are used at the same time, by causing the first switch element to be in the conduction state, complex conjugate matching between the impedance of the low pass filter when the common terminal side is viewed from the first terminal and the impedance of the high pass filter when the common terminal side is viewed from the second terminal can be achieved. In contrast, in the case where the first pass band and the second pass band for which the boundary frequency width is wide are used at the same time, by causing the first switch element to be in the non-conduction state, for example, each of the impedance of the low pass filter when the common terminal side is viewed from the first terminal and the impedance of the high pass filter when the common terminal side is viewed from the second terminal can be matched to a normalizing impedance.

Furthermore, the low pass filter may include an inductor that is arranged in series on a path connecting the common terminal to the first terminal, and a first frequency variable circuit that is connected to the path. The first frequency variable circuit may include an LC series circuit including an inductor and a capacitor that are connected in series with each other, and a second switch element that is connected to the LC series circuit. The first transition band may be variable according to conduction and non-conduction of the second switch element.

Accordingly, by causing the second switch element to be in conduction or not to be in conduction according to the frequency relationship of a band within the first frequency band and a band within the third frequency band that are used at the same time, the first transition band of the low pass filter can be varied.

Thus, in a multiplexer that executes CA of the first frequency band and the third frequency band, degradation in the insertion loss can be reduced even if a frequency band to be selected changes.

Furthermore, the second switch element may be connected between a connection node between the inductor and the capacitor and a ground. A circuit including the first impedance element and the first switch element that are connected in series with each other may be connected between the connection node and the ground.

Accordingly, in the case where the first switch element is in the conduction state, by adding a component of an inductor or a capacitor of the first frequency variable circuit to a component of the first impedance element, the flexibility of the impedance variable width of the first impedance variable circuit is improved. Therefore, the impedance of the low pass filter can be varied with high accuracy. Furthermore, the first impedance element can be miniaturized.

Furthermore, the high pass filter may include a capacitor that is arranged in series on a path connecting the common terminal to the second terminal, and a second frequency variable circuit that is connected to the path. The second frequency variable circuit may include an LC series circuit including an inductor and a capacitor that are connected in series with each other, and a third switch element connected to the LC series circuit. The second transition band may be variable according to conduction and non-conduction of the third switch element.

Accordingly, by causing the third switch element to be in conduction or not to be in conduction according to the frequency relationship of a band within the first frequency band and a band within the third frequency band that are used at the same time, the second transition band of the high pass filter can be varied.

Thus, in a multiplexer that executes CA of the first frequency band and the third frequency band, degradation in the insertion loss can be reduced even if a frequency band to be selected changes.

Furthermore, the third switch element may be connected between a connection node between the inductor and the capacitor and a ground. A circuit including the first impedance element and the first switch element that are connected in series with each other may be connected between the connection node and the ground.

Accordingly, in the case where the first switch element is in the conduction state, by adding a component of the inductor or the capacitor of the second frequency variable circuit to a component of the first impedance element, the flexibility of the impedance variable width of the first impedance variable circuit is improved. Therefore, the impedance of the high pass filter can be varied with high accuracy. Furthermore, the first impedance element can be miniaturized.

Furthermore, the first impedance variable circuit may further include a second impedance element, and a fourth switch element. A circuit including the second impedance element and the fourth switch element that are connected in series with each other may be connected to any one of the common terminal, the first terminal, and the second terminal. In a case where a radio frequency signal of the first pass band and a radio frequency signal of the third pass band are transmitted at the same time, the fourth switch element may be in a conduction state.

Accordingly, in the case where a radio frequency signal of the first pass band and a radio frequency signal of the third pass band are transmitted at the same time, by causing the fourth switch element to be in the conduction state, a combined impedance of the impedance of the low pass filter and the impedance of the high pass filter that have a complex conjugate relationship may be matched to a normalizing impedance by the second impedance element.

Furthermore, the radio frequency circuit may further include a first switch circuit that includes a first common terminal serving as the first terminal and two or more selection terminals and switches connection between the first terminal and the first filter and connection between the first terminal and the third filter, and a second switch circuit that includes a second common terminal serving as the second terminal and two or more selection terminals and switches connection between the second terminal and the second filter and connection between the second terminal and the third filter. A circuit including the first impedance element and the first switch element that are connected with each other may be connected between the first terminal and a ground. A circuit including the second impedance element and the fourth switch element that are connected with each other may be connected between the second terminal and the ground.

With this configuration, in the case where the first pass band and the third pass band for which the boundary frequency width is narrow are used at the same time, according to the conduction state or the non-conduction state of the first switch element and the fourth switch element, the impedance of the low pass filter when the common terminal side is viewed from the first terminal and the impedance of the high pass filter when the common terminal side is viewed from the second terminal can have a complex conjugate relationship. Therefore, complex conjugate matching between the low pass filter and the high pass filter can be achieved. Thus, degradation in the insertion loss in the pass band of the radio frequency circuit in the case where the first pass band and the third pass band are used at the same time can be reduced.

Consequently, in the radio frequency circuit that executes CA of two frequency bands with a narrow frequency interval, degradation in the insertion loss can be reduced.

Furthermore, the circuit including the first impedance element and the first switch element that are connected with each other is arranged between the low pass filter and the first and third filters. Thus, this circuit may further include a function for implementing impedance matching between the low pass filter and the first or third filter according to a combination of frequency bands for which CA is to be executed.

Furthermore, the circuit including the second impedance element and the fourth switch element that are connected with each other is arranged between the high pass filter and the second and third filters. Thus, this circuit may further include a function for implementing impedance matching between the high pass filter and the second or third filter according to a combination of frequency bands for which CA is to be executed.

Furthermore, the first pass band may be any frequency band of LTE (Long Term Evolution) Bands 3, 4, 25, 39, and 66. The third pass band may be any frequency band of LTE Bands 1, 2, 4, 25, 34, and 66.

A boundary frequency width (230 MHz) between LTE Band 1 (reception band: 2110 to 2170 MHz) and Band 3 (reception band: 1805 to 1880 MHz) is, for example, smaller than a boundary frequency width (616 MHz) between the Band 3 and Band 41 (reception band: 2496 to 2690 MHz). Thus, in the case where the Band 1 and the Band 3 are used at the same time, when the overlapping frequency band for the low pass filter and the high pass filter is arranged between the Band 1 and the Band 3, the two bands are close to each other. Accordingly, there is a problem of degradation in insertion loss or demultiplexing characteristics of the radio frequency circuit in the two bands.

By applying the radio frequency circuit mentioned above, complex conjugate matching between the low pass filter and the high pass filter can be achieved. Thus, degradation in the insertion loss in the pass band of the radio frequency circuit in the case where the Band 1 and the Band 3 are used at the same time can be reduced.

A radio frequency front end circuit according to an aspect of the present disclosure includes any one of the radio frequency circuits mentioned above; a first amplifying circuit that is connected to the first filter and the third filter; and a second amplifying circuit that is connected to the second filter.

With this configuration, in a radio frequency front end circuit that executes CA of two pass bands with a narrow frequency interval, degradation in the insertion loss can be reduced.

A communication apparatus according to an aspect of the present disclosure includes an RF signal processing circuit that processes a radio frequency signal received at an antenna element; and the radio frequency front end circuit mentioned above that transmits the radio frequency signal between the antenna element and the RF signal processing circuit.

With this configuration, in a communication apparatus that executes CA of two pass bands with a narrow frequency interval, degradation in the insertion loss can be reduced.

According to the present disclosure, a radio frequency circuit, a radio frequency front end circuit, and a communication apparatus in which degradation in insertion loss is reduced even in the case where CA of two pass bands with a narrow frequency interval is executed, can be provided.

BRIEF DESCRIPTION OF THE SEVERAL VIEWS OF THE DRAWINGS

FIGS. 4BA and 4BB include graphs indicating bandpass characteristics of a multiplexer and the radio frequency front end circuit according to the Comparative Example 2.

DETAILED DESCRIPTION

Figure 1:
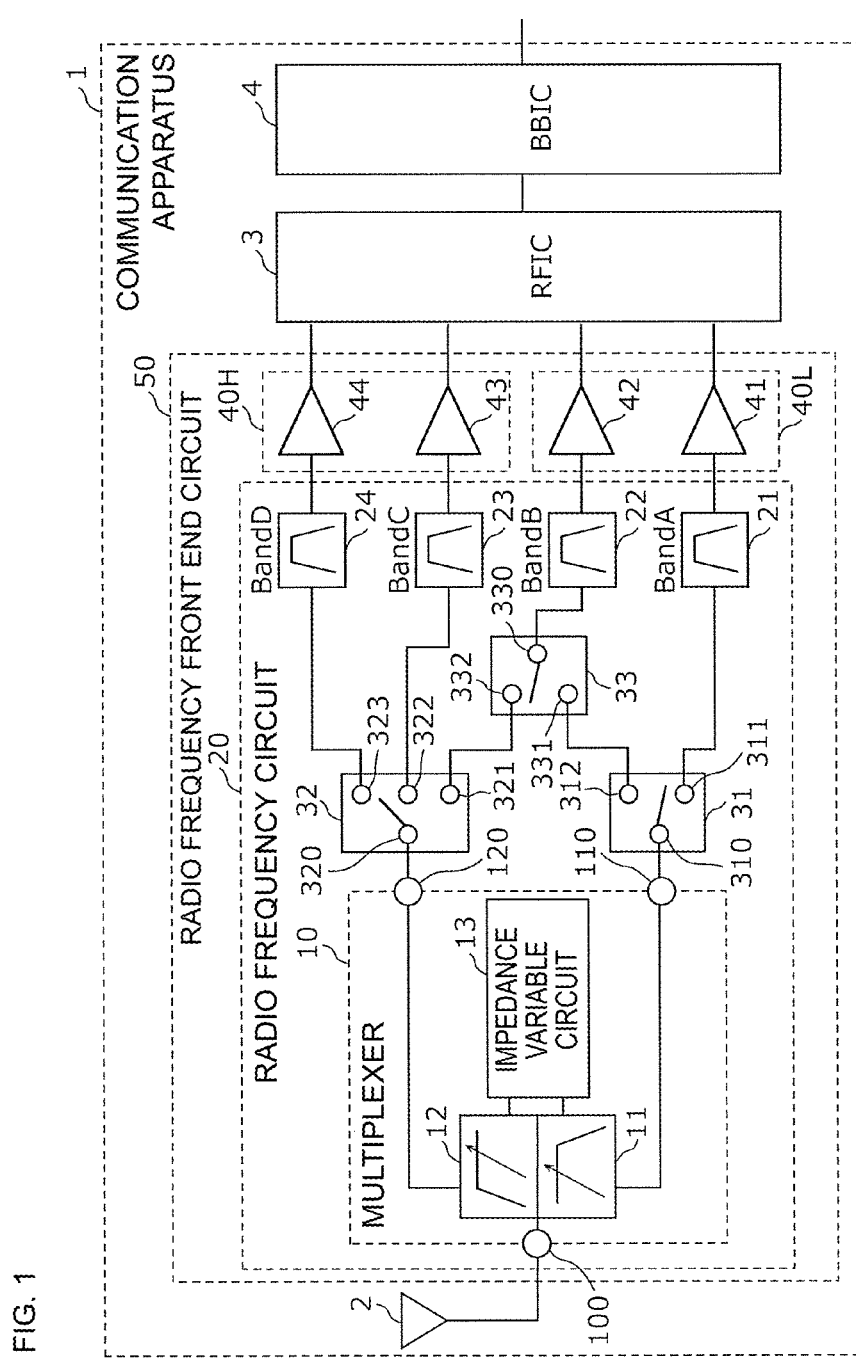
FIG. 1 is a circuit configuration diagram of a communication apparatus according to a first embodiment.

Hereinafter, embodiments of the present disclosure will be explained in detail with reference to examples, modifications, comparative examples, and drawings. The examples and modifications described herein illustrate either general or specific examples. Numerical values, shapes, materials, components, and arrangement and modes of connection of the components described in the examples and modifications are merely examples and are not intended to limit the present disclosure. Components in the examples and modifications, except those described in the independent claims, will be explained as optional components. The sizes or the ratios between the sizes of the components illustrated in the drawings are not strictly correct.

First Embodiment

[1.1 Configuration of Communication Apparatus]

FIG. 1 is a circuit configuration diagram of a communication apparatus 1 according to a first embodiment. As illustrated in FIG. 1, the communication apparatus 1 includes an antenna element 2, a radio frequency front end circuit 50, an RF signal processing circuit (RFIC) 3, and a baseband signal processing circuit (BBIC) 4.

The RFIC 3 is an RF signal processing circuit that processes a radio frequency signal transmitted and received through the antenna element 2. Specifically, the RFIC 3 performs signal processing, via down conversion or the like, on a radio frequency signal (here, a radio frequency reception signal) input from the radio frequency front end circuit 50 through the antenna element 2, and outputs a reception signal generated by the signal processing to the BBIC 4. Furthermore, the RFIC 3 is also able to perform signal processing, via up conversion or the like, on a transmission signal input from the BBIC 4 and output a radio frequency signal (here, a radio frequency transmission signal) generated by the signal processing to a transmission side signal path.

Furthermore, in this embodiment, the RFIC 3 also has a function as a controller that controls connection of switches (described later) included in the radio frequency front end circuit 50, based on a band used (pass band). Specifically, the RFIC 3 switches connection of switches included in the radio frequency front end circuit 50, in accordance with a control signal (not illustrated in the drawing). The controller may be provided outside the RFIC 3. For example, the controller may be provided in the radio frequency front end circuit 50 or the BBIC 4.

Next, the detailed configuration of the radio frequency front end circuit 50 will be explained.

As illustrated in FIG. 1, the radio frequency front end circuit 50 is a reception-system front end circuit and includes a radio frequency circuit 20 and reception amplifiers 41, 42, 43, and 44.

The radio frequency circuit 20 includes a multiplexer 10, switches 31, 32, and 33, and filters 21, 22, 23, and 24. The multiplexer 10 includes a common terminal 100, a first terminal 110, a second terminal 120, a low pass filter 11, a high pass filter 12, and an impedance variable circuit 13. The multiplexer 10 according to the present disclosure may be a multiplexer that splits/combines two frequency band groups as in this embodiment or may be a multiplexer that splits/combines three or more frequency band groups.

The low pass filter 11 is a low frequency band pass filter that is arranged between the common terminal 100 and the first terminal 110, allows a radio frequency signal in a first frequency band (the first frequency band is defined as a pass band) to pass through, and attenuates a radio frequency signal in a second frequency band (the second frequency band is defined as an attenuation band). The low pass filter 11 includes a first frequency variable circuit including a second switch element and an LC series circuit. At least one of the pass band and the attenuation band of the low pass filter 11 is variable according to conduction or non-conduction of the second switch element. The low pass filter according to the present disclosure may be a filter that does not include the first frequency variable circuit and the pass band and the attenuation of the low pass filter may be fixed.

The high pass filter 12 is a high frequency band pass filter that is arranged between the common terminal 100 and the second terminal 120, allows a radio frequency signal in a third frequency band (the third frequency band is defined as a pass band) to pass through, and attenuates a radio frequency signal in a fourth frequency band (the fourth frequency band is defined as an attenuation band). The high pass filter 12 includes a second frequency variable circuit including a third switch element and an LC series circuit. At least one of the pass band and the attenuation band of the high pass filter 12 is variable according to conduction or non-conduction of the third switch element. A high pass filter according to the present disclosure may be a filter that does not include the second frequency variable circuit and the pass band and the attenuation band of the high pass filter may be fixed.

The low pass filter 11 and the high pass filter 12 configure a diplexer.

The impedance variable circuit 13 is a first impedance variable circuit that is connected to the low pass filter 11 and the high pass filter 12. The impedance variable circuit 13 includes a first impedance element and a first switch element connected to the first impedance element. In a multiplexer according to the present disclosure, the impedance variable circuit may be connected to at least one of the low pass filter 11 and the high pass filter 12.

An inductor or a capacitor is exemplified as the first impedance element.

The switch 31 includes a common terminal 310 and selection terminals 311 and 312, and the common terminal 310 is connected to the first terminal 110. The switch 31 is a switch circuit of an SPDT (Single Pole Double Throw) type in which the common terminal 310 may be connected to one of the selection terminals 311 and 312. The switch 31 may have a circuit configuration in which two switches of an SPST (Single Pole Single Throw) type are arranged in parallel to each other. Furthermore, the switch 31 may be a switch circuit such as SP3T or SP4T. In this case, a common terminal and a necessary selection terminal may be used.

The switch 32 includes a common terminal 320 and selection terminals 321, 322, and 323. The common terminal 320 is connected to the second terminal 120. The switch 32 is a switch circuit of an SP3T type in which the common terminal 320 may be connected to one of the selection terminals 321, 322, and 323. The switch 32 may have a circuit configuration in which three SPST switches are arranged in parallel to one another. Furthermore, the switch 32 may be a switch circuit such as SP4T. In this case, a common terminal and a necessary selection terminal may be used.

The switch 33 includes a common terminal 330 and selection terminals 331 and 332. The common terminal 330 is connected an input terminal of the filter 22, the selection terminal 331 is connected to the selection terminal 312, and the selection terminal 332 is connected to the selection terminal 321. The switch 33 is an SPDT switch circuit in which the common terminal 330 may be connected to one of the selection terminals 331 and 332. The switch 33 may have a circuit configuration in which two SPST switches are arranged in parallel to each other. Furthermore, the switch 33 may be a switch circuit such as SP3T or SP4T. In this case, a common terminal and a necessary selection terminal may be used.

The filter 21 is a band pass filter in which an input terminal is connected to the selection terminal 311 and a Band A is defined as the pass band. The filter 22 is a band pass filter in which the input terminal is connected to the common terminal 330 and a Band B is defined as the pass band. The filter 23 is a band pass filter in which an input terminal is connected to the selection terminal 322 and a Band C is defined as the pass band. The filter 24 is a band pass filter in which an input terminal is connected to the selection terminal 323 and a Band D is defined as the pass band. In this embodiment, the Band A, the Band B, the Band C, and the Band D are in ascending order of frequency. In a radio frequency front end circuit according to the present disclosure, at least three filters of different pass bands may be provided. For example, the filter 24 is not necessarily provided.

In the radio frequency front end circuit 50 illustrated in FIG. 1, the filter 21 is a first filter having a first pass band (Band A). The filter 23 is a second filter having a second pass band (Band C) as the pass band. The filter 22 is a third filter having a third pass band (Band B) as the pass band.

The reception amplifier 41 is connected to an output terminal of the filter 21, the reception amplifier 42 is connected to an output terminal of the filter 22, the reception amplifier 43 is connected to an output terminal of the filter 23, and the reception amplifier 44 is connected to an output terminal of the filter 24. Each of the reception amplifiers 41 to 44 is, for example, a low noise amplifier including a transistor or the like. The reception amplifiers 41 and 42 form an amplifying circuit 40L (first amplifying circuit). The reception amplifiers 43 and 44 form an amplifying circuit 40H (second amplifying circuit). Each of the amplifying circuits 40L and 40H may include a single reception amplifier. In this case, an SPDT switch is arranged between the amplifying circuit 40L and the filters 21 and 22 and between the amplifying circuit 40H and the filters 23 and 24.

Figure 2:
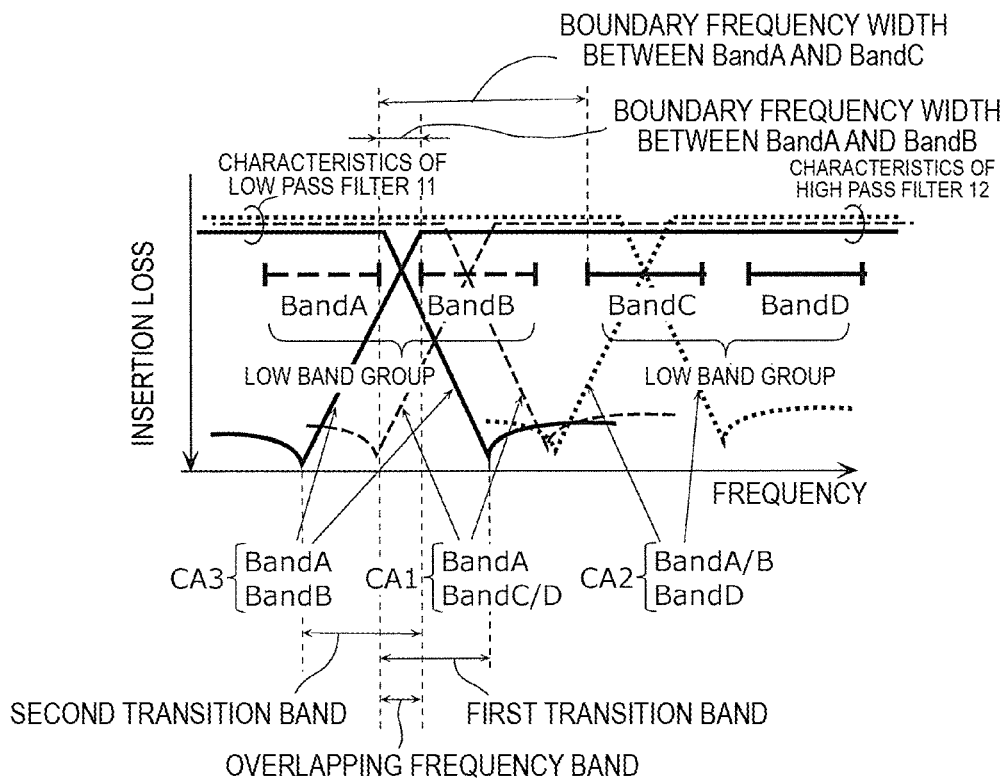
FIG. 2 is a diagram illustrating the relationship of bandpass characteristics and CA modes of a radio frequency circuit.

FIG. 2 is a diagram illustrating the relationship of bandpass characteristics and CA modes of a radio frequency circuit. In FIG. 2, frequency allocations to the Band A, the Band B, the Band C, and the Band D are illustrated. For example, the Band A, the Band B, the Band C, and the Band D are in ascending order of frequency allocated. Furthermore, in FIG. 2, bandpass characteristics of the low pass filter 11 of the frequency variable type and bandpass characteristics of the high pass filter 12 of the frequency variable type. The Band A and the Band B belong to, for example, a low band group, and the Band C and the Band D belong to, for example, a high band group. Furthermore, the frequency interval between bands is defined as a boundary frequency width, a frequency band in which transition from the pass band (first frequency band) to the attenuation band (second frequency band) of the low pass filter 11 occurs is defined as a first transition band, and a frequency band in which transition from the pass band (third frequency band) to the attenuation band (fourth frequency band) of the high pass filter 12 occurs is defined as a second transition band. Furthermore, a frequency band where the first transition band and the second transition band overlap is defined as an overlapping frequency band.

In the configuration of frequency bands mentioned above, the boundary frequency width between the Band A and the Band B is smaller than the boundary frequency width between the Band A and the Band C.

The multiplexer 10 and the radio frequency front end circuit 50 are capable of transmitting radio frequency signals of two bands mentioned below, which are at least combinations of two bands out of the Band A, the Band B, the Band C, and the Band D, at the same time. Specifically, (1) a CA mode 1 by a combination of the Band A and the Band C or D, (2) a CA mode 2 by a combination of the Band A or B and the Band D, and (3) a CA mode 3 by a combination of the Band A and the Band B can be executed.

In the radio frequency front end circuit 50 according to this embodiment, in the case where the CA mode 3 by the Band A and the Band B is executed, the filter 21 is connected to the first terminal 110 via the switch 31, and the filter 22 is connected to the second terminal 120 via the switches 32 and 33. In this state, due to conduction of the first switch element in the impedance variable circuit 13, the impedance of the low pass filter 11 when the common terminal 100 side is viewed from the first terminal 110 and the impedance of the high pass filter 12 when the common terminal 100 side is viewed from the second terminal 120 have a complex conjugate relationship.

Accordingly, even in the case where the boundary frequency width is narrow, by complex conjugate matching between the low pass filter 11 and the high pass filter 12, a degradation in the insertion loss in the pass band of the multiplexer 10 in the case where the Band A and the Band B are used at the same time can be reduced. Therefore, in the multiplexer 10 that executes CA of two bands with a narrow boundary frequency width, a degradation in the insertion loss can be reduced.

In the first and second embodiments, a state in which "two impedances have a complex conjugate relationship" represents a state in which complex components of two impedances are cancelled out to be approximate to zero. That is, when one impedance is represented by $R_1+jX_1$ and the other impedance is represented by $R_2+jX_2$, a state represented by $X_1>0$ and $X_2<0$ (one impedance is inductive and the other impedance is capacitive) is satisfied, and specifically, a state represented by $X_1+X_2=0$ is satisfied.

[1.2 Radio Frequency Front End Circuit According to Comparative Examples]

To explain problems in conventional multiplexers, configurations and bandpass characteristics of radio frequency front end circuits according to comparative examples will be explained.

Figure 3A:
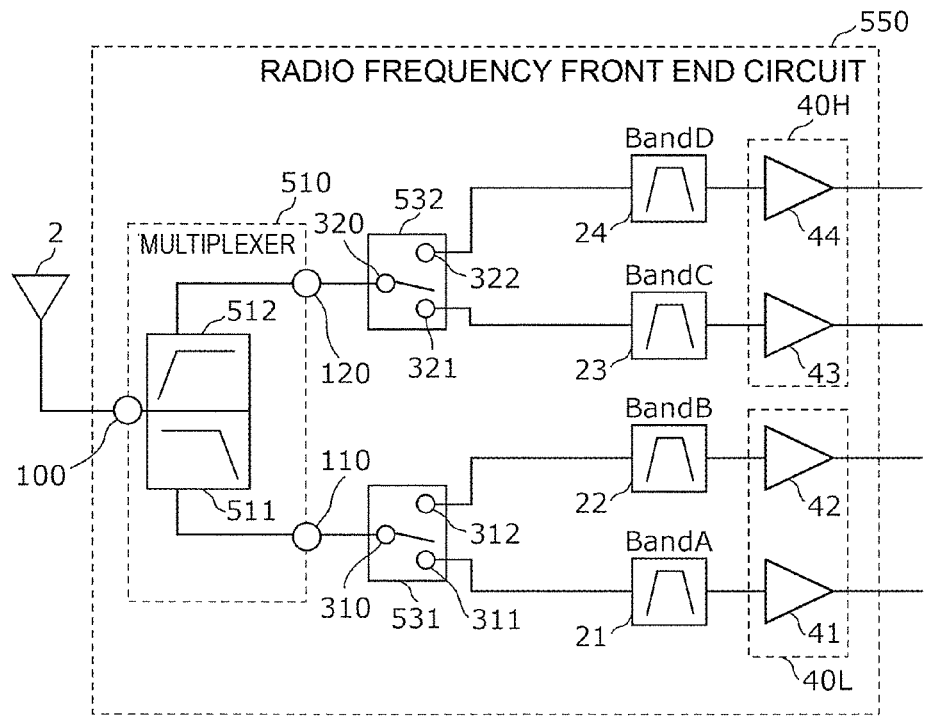
FIG. 3A is a circuit configuration diagram of a radio frequency front end circuit and a peripheral circuit according to Comparative Example 1.

FIG. 3A is a circuit configuration diagram of a radio frequency front end circuit 550 and the antenna element 2 according to Comparative Example 1. As illustrated in FIG. 3A, the radio frequency front end circuit 550 includes a multiplexer 510, switches 531 and 532, filters 21, 22, 23, and 24, and reception amplifiers 41, 42, 43, and 44. The radio frequency front end circuit 550 differs from the radio frequency front end circuit 50 according to the first embodiment in configurations of a multiplexer and switches. Explanation for the same configuration features in the radio frequency front end circuit 550 according to the Comparative Example 1 as those in the radio frequency front end circuit 50 according to the first embodiment will be omitted, and different configuration features will be mainly explained.

The multiplexer 510 includes a common terminal 100, a first terminal 110, a second terminal 120, a low pass filter 511, and a high pass filter 512.

The low pass filter 511 is a low frequency band pass filter of a frequency fixed type that is arranged between the common terminal 100 and the first terminal 110, allows a radio frequency signal in a first frequency band to pass through (the first frequency band is defined as a pass band), and attenuates a radio frequency signal in a second frequency band (the second frequency band is defined as an attenuation band).

The high pass filter 512 is a high frequency band pass filter of a frequency fixed type that is arranged between the common terminal 100 and the second terminal 120, allows a radio frequency signal in a third frequency band to pass through (the third frequency band is defined as a pass band), and attenuates a radio frequency signal in a fourth frequency band (the fourth frequency band is defined as an attenuation band).

The low pass filter 511 and the high pass filter 512 configure a diplexer.

The switch 531 includes a common terminal 310 and selection terminals 311 and 312, and the common terminal 310 is connected to the first terminal 110. The switch 531 is an SPDT switch circuit in which the common terminal 310 may be connected to one of the selection terminals 311 and 312.

The switch 532 includes a common terminal 320 and selection terminals 321 and 322, and the common terminal 320 is connected to the second terminal 120. The switch 532 is an SPDT switch circuit in which the common terminal 320 may be connected to one of the selection terminals 321 and 322.

The filter 21 is a band pass filter in which an input terminal is connected to the selection terminal 311, and the Band A is defined as the pass band. The filter 22 is a band pass filter in which an input terminal is connected to the selection terminal 312, and the Band B is defined as the pass band. The filter 23 is a band pass filter in which an input terminal is connected to the selection terminal 321, and the Band C is defined as the pass band. The filter 24 is a band pass filter in which an input terminal is connected to the selection terminal 322, and the Band D is defined as the pass band.

Figure 3B:
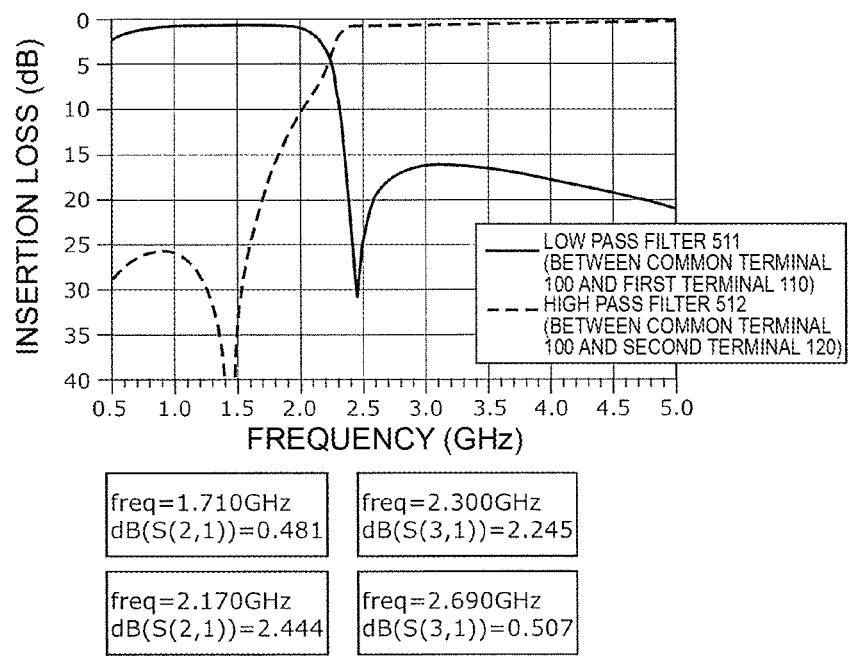
FIG. 3B is a graph indicating bandpass characteristics of a multiplexer according to the Comparative Example 1.

FIG. 3B is a graph indicating bandpass characteristics of the multiplexer 510 according to the Comparative Example 1. In FIG. 3B, bandpass characteristics of the low pass filter 511 between the common terminal 100 and the first terminal 110 and bandpass characteristics of the high pass filter 512 between the common terminal 100 and the second terminal 120. In this comparative example, LTE Band 3 (band: 1710 to 1880 MHz) is defined as a Band A, LTE Band 1 (band: 1920 to 2170 MHz) is defined as a Band B, LTE Band 40 (band: 2300 to 2400 MHz) is defined as a Band C, and LTE Band 41 (band: 2496 to 2690 MHz) is defined as a Band D.

With the above-mentioned configuration of the radio frequency front end circuit 550 according to the Comparative Example 1, the Band A and the Band B are included in the pass band of the low pass filter 511, and the Band C and the Band D are included in the pass band of the high pass filter 512. Furthermore, an overlapping frequency band of the low pass filter 511 and the high pass filter 512 is set between the Band B and the Band C.

In the radio frequency front end circuit 550 according to this comparative example, (i) CA of the Band 3 and the Band 40 can be executed by connecting the common terminal 310 with the selection terminal 311 and connecting the common terminal 320 with the selection terminal 321, (ii) CA of the Band 3 and the Band 41 can be executed by connecting the common terminal 310 with the selection terminal 311 and connecting the common terminal 320 with the selection terminal 322, (iii) CA of the Band 1 and the Band 40 can be executed by connecting the common terminal 310 with the selection terminal 312 and connecting the common terminal 320 with the selection terminal 321, and (iv) CA of the Band 1 and the Band 41 can be executed by connecting the common terminal 310 with the selection terminal 312 and connecting the common terminal 320 with the selection terminal 322. However, in the case of (iii), the boundary frequency width between the Band 1 and the Band 40 is 130 MHz, which is narrow, and insertion loss (2.444 dB) in a high frequency end (2170 MHz) of the pass band of the low pass filter 511 is significantly degraded, compared to insertion loss (0.481 dB) in a low frequency end (1710 MHz) of the pass band, as illustrated in FIG. 3B. Furthermore, insertion loss (2.245 dB) in a low frequency end (2300 MHz) of the pass band of the high pass filter 512 is significantly degraded, compared to insertion loss (0.507 dB) in a high frequency end (2690 MHz) of the pass band. That is, CA of the Band 1 and the Band 40 has a problem of degradation in insertion loss and demultiplexing characteristics of the radio frequency front end circuit 550 in the Band 1 and the Band 40 because these two bands are close to each other. Furthermore, because the impedance variable circuit 13 is not provided in the multiplexer 510, unlike in the radio frequency front end circuit 50 according to the first embodiment, the impedance of the low pass filter 511 when the common terminal 100 side is viewed from the first terminal 110 and the impedance of the high pass filter 512 when the common terminal 100 side is viewed from the second terminal 120 cannot be adjusted to a complex conjugate relationship.

Furthermore, in the radio frequency front end circuit 550 according to the Comparative Example 1, the Band 3 and the Band 1 that belong to the same frequency band group are connected to the low pass filter 511 via the switch 531. Therefore, CA of the Band 3 and the Band 1 cannot be executed.

A radio frequency front end circuit 551 according to Comparative Example 2 described below is considered when a configuration that is able to execute CA of the Band 3 and the Band 1 that belong to the same frequency band group is assumed based on the radio frequency front end circuit 550 according to the Comparative Example 1.

Figure 4A:
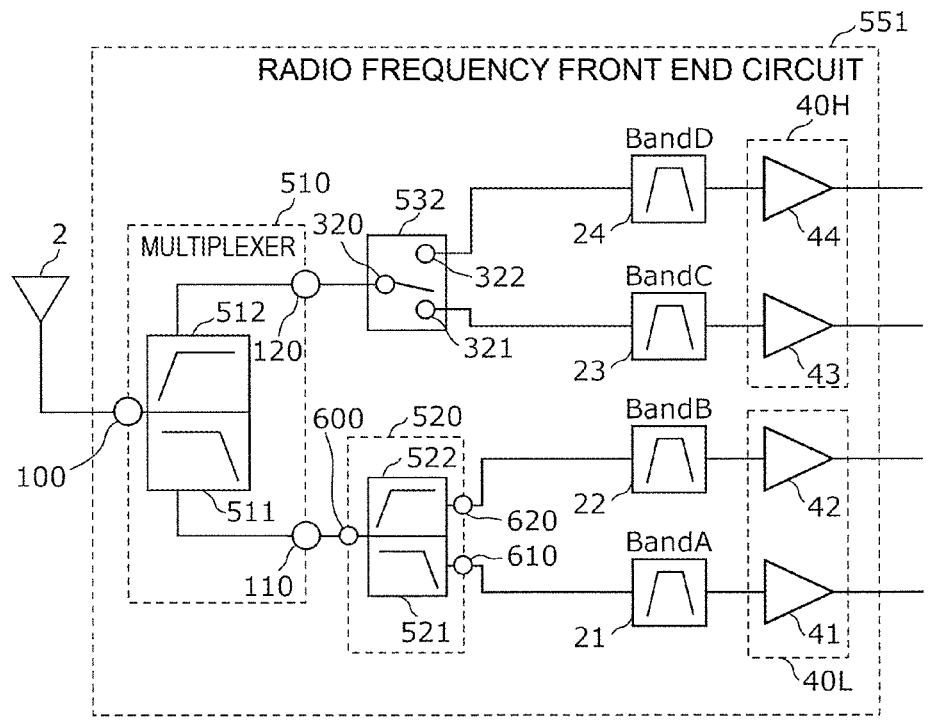
FIG. 4A is a circuit configuration diagram of a radio frequency front end circuit and a peripheral circuit according to Comparative Example 2.

FIG. 4A is a circuit configuration diagram of the radio frequency front end circuit 551 and the antenna element 2 according to the Comparative Example 2. As illustrated in FIG. 4A, the radio frequency front end circuit 551 includes a multiplexer 510, a switch 531, a diplexer 520, filters 21, 22, 23, and 24, and reception amplifiers 41, 42, 43, and 44. The radio frequency front end circuit 551 differs from the radio frequency front end circuit 550 according to the Comparative Example 1 in that the diplexer 520 is arranged in place of the switch 531. Explanation for the same configuration features in the radio frequency front end circuit 551 according to the Comparative Example 2 as those in the radio frequency front end circuit 550 according to the Comparative Example 1 will be omitted, and different configuration features will be mainly explained.

The diplexer 520 includes a common terminal 600, input/output terminals 610 and 620, a low pass filter 521, and a high pass filter 522.

The low pass filter 521 is a low frequency band pass filter of a frequency fixed type that is connected between the common terminal 600 and the input/output terminal 610, allows a radio frequency signal of the Band A to pass through, and attenuates a radio frequency signal of the Band B. The high pass filter 522 is a high frequency band pass filter of a frequency fixed type that is connected between the common terminal 600 and the input/output terminal 620, allows a radio frequency signal of the Band B to pass through, and attenuates a radio frequency signal of the Band A.

With the configuration of the radio frequency front end circuit 551 mentioned above, the diplexer 520 is arranged in the downstream of the low pass filter 521. Therefore, CA of the Band A and the Band B can be executed. Furthermore, by connecting the common terminal 320 with the selection terminal 321 in the switch 532, concurrent use (3CA) of the Band A, the Band B, and the Band C can also be executed. Furthermore, by connecting the common terminal 320 with the selection terminal 322 in the switch 532, 3CA of the Band A, the Band B, and the Band D can also be executed.

FIGS. 4BA and 4BB are graphs indicating bandpass characteristics of the multiplexer 510 according to the Comparative Example 2. In FIG. 4BA, bandpass characteristics of the low pass filter 511 and the low pass filter 521 between the common terminal 100 and the input/output terminal 610, bandpass characteristics of the low pass filter 511 and the high pass filter 522 between the common terminal 100 and the input/output terminal 620, and bandpass characteristics of the high pass filter 512 between the common terminal 100 and the second terminal 120 are illustrated. Furthermore, in FIG. 4BB, bandpass characteristics of the low pass filter 511, the low pass filter 521, and the filter 21, the low pass filter 511 and the low pass filter 521 being arranged between the common terminal 100 and the output terminal of the filter 21, bandpass characteristics of the low pass filter 511, the high pass filter 522, and the filter 22, the low pass filter 511 and the high pass filter 522 being arranged between the common terminal 100 and the output terminal of the filter 22, and bandpass characteristics of the high pass filter 512 and the filter 23, the high pass filter 512 being arranged between the common terminal 100 and the output terminal of the filter 23, are illustrated. Also in this comparative example, LTE Band 3 is defined as the Band A, LTE Band 1 is defined as the Band B, LTE Band 40 is defined as the Band C, and LTE Band 41 is defined as the Band D.

In the radio frequency front end circuit 551 according to this comparative example, (i) CA of the Band 3 and the Band 40 can be executed by connecting the common terminal 320 with the selection terminal 321, (ii) CA of the Band 3 and the Band 41 can be executed by connecting the common terminal 320 with the selection terminal 322, (iii) CA of the Band 1 and the Band 40 can be executed by connecting the common terminal 320 with the selection terminal 321, (iv) CA of the Band 1 and the Band 41 can be executed by connecting the common terminal 320 with the selection terminal 322, v) CA of the Band 3 and the Band 1 can be executed, (vi) 3CA of the Band 3, the Band 1, and the Band 40 can be executed by connecting the common terminal 320 with the selection terminal 321, and (vii) 3CA of the Band 3, the Band 1, and the Band 41 can be executed by connecting the common terminal 320 with the selection terminal 322.

However, because the diplexer 520 is inserted between the low pass filter 511 and the filters 21 and 22, insertion loss (4.864 dB) in a high frequency end (1880 MHz) of the pass band of the low pass filter 511 and the low pass filter 521 significantly degrades, as illustrated in FIG. 4BA. Furthermore, as illustrated in part FIG. 4BA, insertion loss (3.113 dB) in a low frequency end (1920 MHz) of the pass band and insertion loss (2.863 dB) in a high frequency end (2170 MHz) of the pass band of the low pass filter 511 and the high pass filter 522 significantly degrade. Furthermore, because the boundary frequency width between the Band 1 and the Band 40 is 130 MHz, which is narrow, insertion loss (2.176 dB) in a low frequency end (2300 MHz) of the pass band of the high pass filter 512 significantly degrades, compared to insertion loss (0.510 MHz) in a high frequency end (2690 MHz) of the pass band, as illustrated in FIG. 4BA.

Consequently, for example, in the case of (vi) mentioned above, as illustrated in FIG. 4BB, there is a problem of degradation in insertion loss (3.313 dB) in the Band 3 between the common terminal 100 and the filter 21, insertion loss (4.054 dB) in the Band 1 between the common terminal 100 and the filter 22, and insertion loss (3.544 dB) in the Band 40 between the common terminal 100 and the filter 23.

[1.3 Multiplexer According to Examples]

Figure 5A:
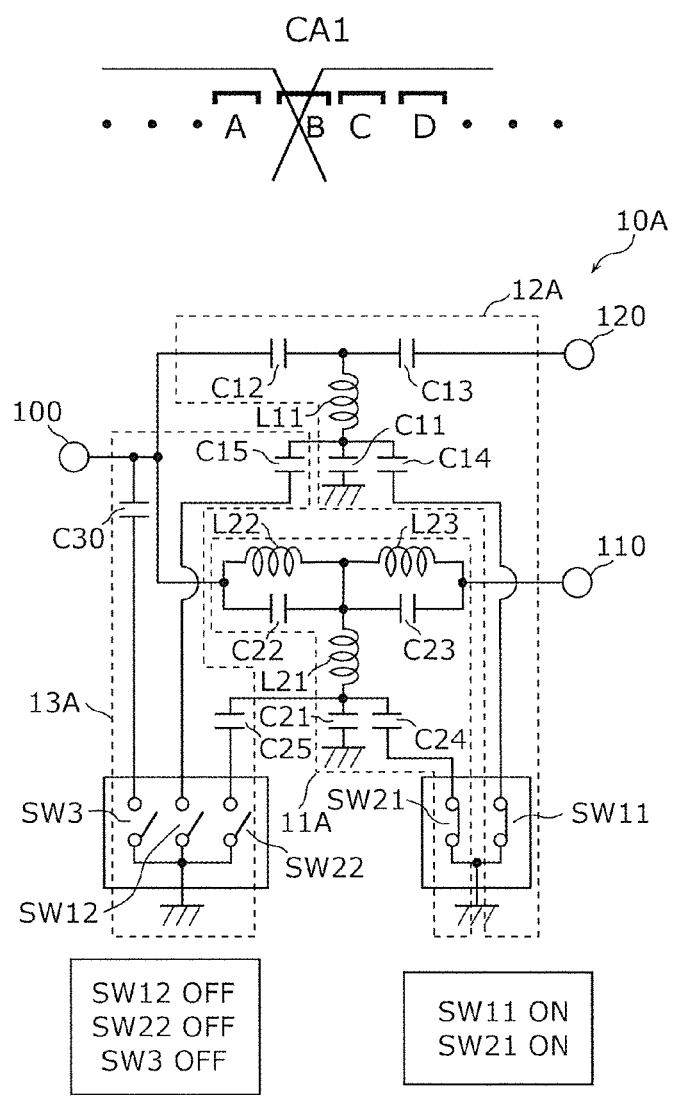
FIG. 5A is a circuit configuration diagram in a CA mode 1 of a multiplexer according to Example 1.
Figure 6A:
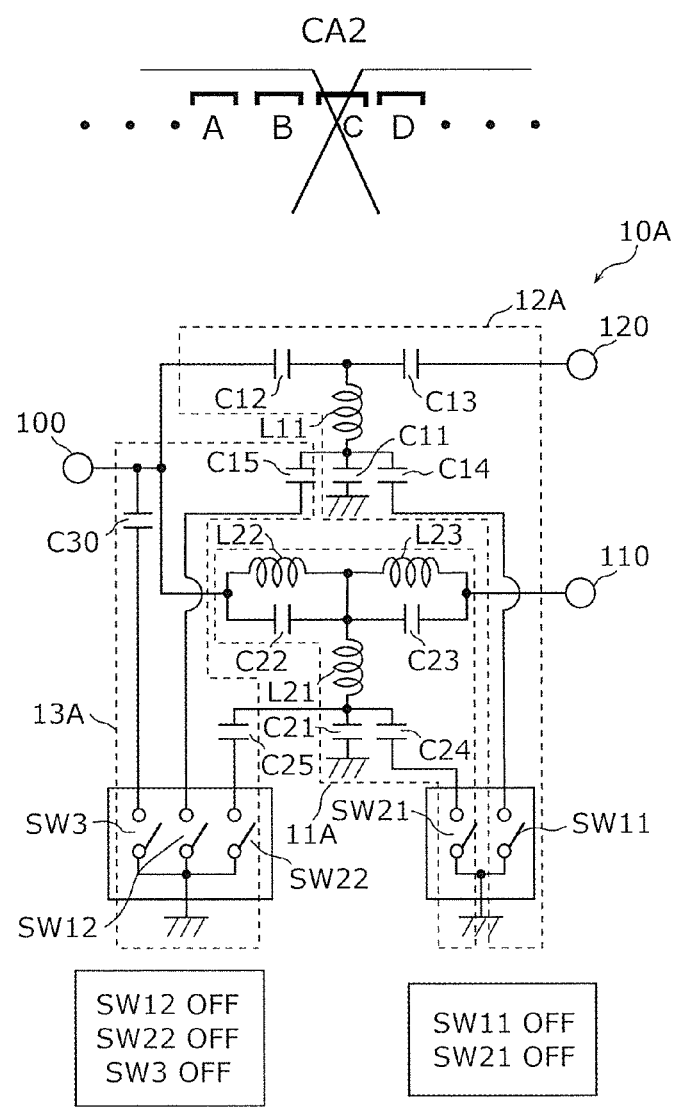
FIG. 6A is a circuit configuration diagram in a CA mode 2 of the multiplexer according to the Example 1.
Figure 7A:
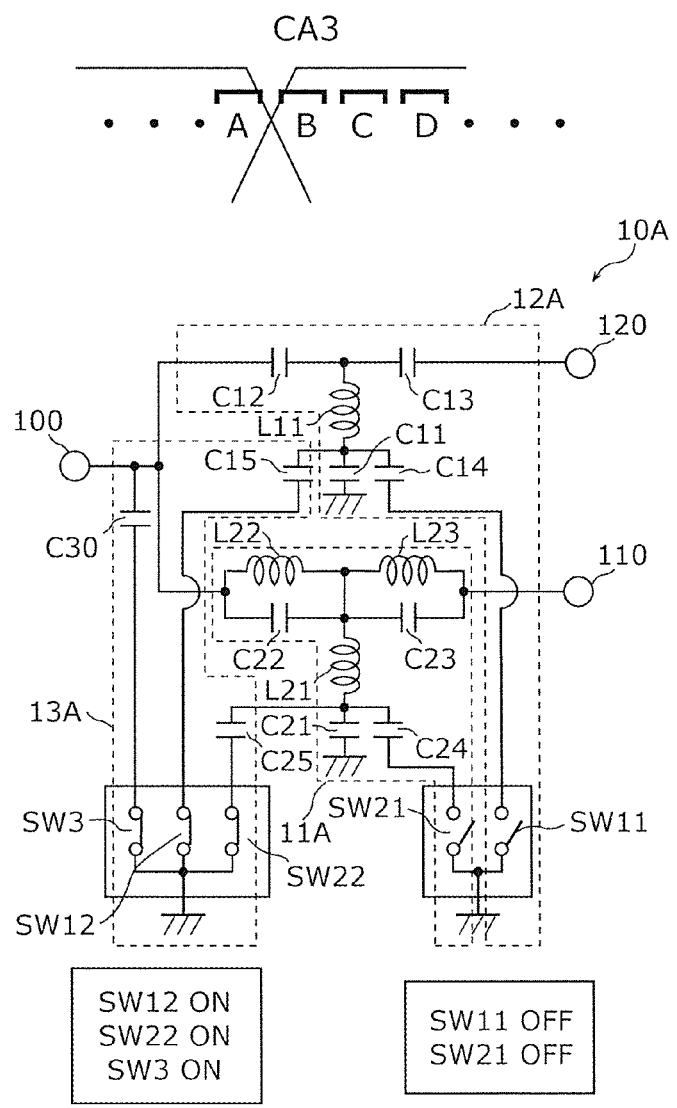
FIG. 7A is a circuit configuration diagram in a CA mode 3 of the multiplexer according to the Example 1.

FIG. 5A is a circuit configuration diagram in a CA mode 1 of a multiplexer 10A according to Example 1. FIG. 6A is a circuit configuration diagram in a CA mode 2 of the multiplexer 10A according to the Example 1. FIG. 7A is a circuit configuration diagram in a CA mode 3 of the multiplexer 10A according to the Example 1. The multiplexer 10A according to the Example 1 includes a common terminal 100, a first terminal 110, a second terminal 120, a low pass filter 11A, a high pass filter 12A, and an impedance variable circuit 13A. The multiplexer 10A according to the Example 1 is a specific circuit configuration example of the multiplexer 10 illustrated in FIG. 1.

The low pass filter 11A includes inductors L21, L22, and L23, capacitors C21, C22, C23, and C24, and a switch SW21 (second switch element).

The inductors L22 and L23 are arranged in series with each other on a path that connects the common terminal 100 to the first terminal 110. More specifically, a series arm circuit including the inductor L22 and the capacitor C22 that are connected in parallel with each other and a series arm circuit including the inductor L23 and the capacitor C23 that are connected in parallel with each other are connected in series with each other on the path that connects the common terminal 100 to the first terminal 110. The two series arm circuits mentioned above each configure an LC parallel resonant circuit.

The inductor L21, the capacitors C21 and C24, and the switch SW21 configure a first frequency variable circuit. The inductor L21 and the capacitor C21 configure an LC series circuit. A circuit including the capacitor C24 and the switch SW21 that are connected in series with each other is connected between a connection node between the inductor L21 and the capacitor C21 and the ground. The switch SW21 is a second switch element that is connected to the connection node with the capacitor C24 interposed therebetween. With the configuration mentioned above, the first transition band (see FIG. 2) of the low pass filter 11A is variable according to conduction and non-conduction of the switch SW21.

The capacitors C22, C23, and C24 may not be provided.

Furthermore, one of the capacitors C21 and C24 may not be provided. Furthermore, the switch SW21 may be connected to one of both ends of the LC series circuit instead of being connected to the connection node mentioned above. However, in the case where the switch SW21 is connected to the connection node between the LC series circuit and the series arm circuit of the low pass filter 11A, another impedance element needs to be inserted in series between the connection node and the series arm circuit. Furthermore, in the case where the switch SW21 is connected to a connection node between the LC series circuit and the ground, another impedance element needs to be inserted in series between the connection node and the ground.

The high pass filter 12A includes an inductor L11, capacitors C11, C12, C13, and C14, and a switch SW11 (third switch element).

The capacitors C12 and C13 are connected in series with each other on a path that connects the common terminal 100 to the second terminal 120.

The inductor L11, the capacitors C11 and C14, and the switch SW11 configure a second frequency variable circuit. The inductor L11 and the capacitor C11 configure an LC series circuit. A circuit including the capacitor C14 and the switch SW11 that are connected in series with each other is connected between a connection node between the inductor L11 and the capacitor C11 and the ground. The switch SW11 is a third switch element that is connected to the connection node with the capacitor C14 interposed therebetween. With the configuration mentioned above, the second transition band (see FIG. 2) of the high pass filter 12A is variable according to conduction and non-conduction of the switch SW11.

One of the capacitors C11 and C14 may not be provided. Furthermore, the switch SW11 may be connected in parallel with one of both ends of the LC series circuit instead of being connected to the connection node. However, in the case where the switch SW11 is connected to the connection node between the LC series circuit and the series arm circuit of the high pass filter 12A, another impedance element needs to be inserted in series between the connection node and the series arm circuit. Furthermore, in the case where the switch SW11 is connected to the connection node between the LC series circuit and the ground, another impedance element needs to be inserted in series between the connection node and the ground.

The impedance variable circuit 13A includes a capacitor C15 (first impedance element), a capacitor C25 (first impedance element), a capacitor C30 (second impedance element), a switch SW12 (first switch element), a switch SW22 (first switch element), and a switch SW3 (fourth switch element). The capacitors C15 and C25, each includes a function as the first impedance element. However, the capacitors C15 and C25 may not be the same element but may be different elements having different capacitances. Furthermore, the switches SW12 and SW22 each have a function as the first switch element. However, the switches SW12 and SW22 may not be the same element but may be different elements.

A circuit including the capacitor C25 and the switch SW22 that are connected in series with each other is connected between the connection node between the inductor L21 and the capacitor C21 and the ground. Accordingly, in the case where the switch SW22 is in a conduction state, by adding a component of the capacitor C21 of the first frequency variable circuit to a component of the capacitor C25, the flexibility of the impedance variable width of the impedance variable circuit 13A is improved. Therefore, the impedance of the low pass filter 11A can be varied with high accuracy. Furthermore, the capacitor C25 can be miniaturized.

Furthermore, a circuit including the capacitor C15 and the switch SW12 that are connected in series with each other is connected between the connection node between the inductor L11 and the capacitor C11 and the ground. Accordingly, in the case where the switch SW12 in the conduction state, by adding a component of the capacitor C11 of the second frequency variable circuit to a component of the capacitor C15, the flexibility of the impedance variable width of the impedance variable circuit 13A is improved. Therefore, the impedance of the high pass filter 12A can be varied with high accuracy. Furthermore, the capacitor C15 can be miniaturized.

Furthermore, a circuit including the capacitor C30 and the switch SW3 that are connected in series with each other is connected between the common terminal 100 and the ground. The capacitor C30 may be an inductor.

With the configuration mentioned above, due to conduction of the switches SW12 and SW22, the impedance of the low pass filter 11A when the common terminal 100 side is viewed from the first terminal 110 and the impedance of the high pass filter 12A when the common terminal 100 side is viewed from the second terminal 120 have a complex conjugate relationship.

By applying the multiplexer 10A according to this example to the multiplexer 10 of the radio frequency front end circuit 50 according to the first embodiment, (i) CA of the Band A and the Band C can be executed by connecting the common terminal 310 with the selection terminal 311 and connecting the common terminal 320 with the selection terminal 322, (ii) CA of the Band A and the Band D can be executed by connecting the common terminal 310 with the selection terminal 311 and connecting the common terminal 320 with the selection terminal 323, (iii) CA of the Band B and the Band C can be executed by connecting the common terminal 310 with the selection terminal 312, connecting the common terminal 330 with the selection terminal 331, and connecting the common terminal 320 with the selection terminal 322, (iv) CA of the Band B and the Band D can be executed by connecting the common terminal 310 with the selection terminal 312, connecting the common terminal 330 with the selection terminal 331, and connecting the common terminal 320 with the selection terminal 323, and (v) CA of the Band A and the Band B can be executed by connecting the common terminal 310 with the selection terminal 311, connecting the common terminal 320 with the selection terminal 321, and connecting the common terminal 330 with the selection terminal 332.

With the circuit configuration mentioned above, (1) in the case of the CA mode 1 in which the Band A and the Band C or D are used at the same time, as illustrated in FIG. 5A, the switches SW11 and SW21 are in the conduction state, and the switches SW12, SW22, and SW3 are in the non-conduction state, (2) in the case of the CA mode 2 in which the Band A or B and the Band D are used at the same time, as illustrated in FIG. 6A, the switches SW11 and SW21 are in the non-conduction state, and the switches SW12, SW22, and SW3 are in the non-conduction state, and (3) in the case of the CA mode 3 in which the Band A and the Band B are used at the same time, as illustrated in FIG. 7A, the switches SW11 and SW21 are in the non-conduction state, and the switches SW12, SW22, and SW3 are in the conduction state. That is, in the case where a radio frequency signal of the Band A and a radio frequency signal of the Band B are transmitted at the same time, the switches SW12 and SW22 are in the conduction state. In the case where a radio frequency signal of the Band A and a radio frequency signal of the Band B are transmitted exclusively from each other, the switches SW12 and SW22 are in the non-conduction state. Accordingly, in the case where the Band A and the Band B, which have a narrow boundary frequency width, are used at the same time, by causing the switches SW12 and SW22 to be in the conduction state, complex conjugate matching between the impedance of the low pass filter 11A when the common terminal 100 side is viewed from the first terminal 110 and the impedance of the high pass filter 12A when the common terminal 100 side is viewed from the second terminal 120 can be achieved. In contrast, in the case where the Band A or B and the Band D, which have a wide boundary frequency width, are used at the same time and in the case where the Band A and the Band C or D, which have a wide boundary frequency width, are used at the same time, by causing the switches SW12 and SW22 to be in the non-conduction state, for example, each of the impedance of the low pass filter 11A when the common terminal 100 side is viewed from the first terminal 110 and the impedance of the high pass filter 12A when the common terminal 100 side is viewed from the second terminal 120 can be matched to a normalizing impedance (for example, 50Ω).

Herein, a state in which a radio frequency signal a and a radio frequency signal b are transmitted exclusively from each other represents a state in which the radio frequency signal a and the radio frequency signal b are not transmitted at the same time. Specifically, the radio frequency signal b is not transmitted during the period of time in which the radio frequency signal a is transmitted, and the radio frequency signal a is not transmitted during the period of time in which the radio frequency signal b is transmitted.

Figure 5B:
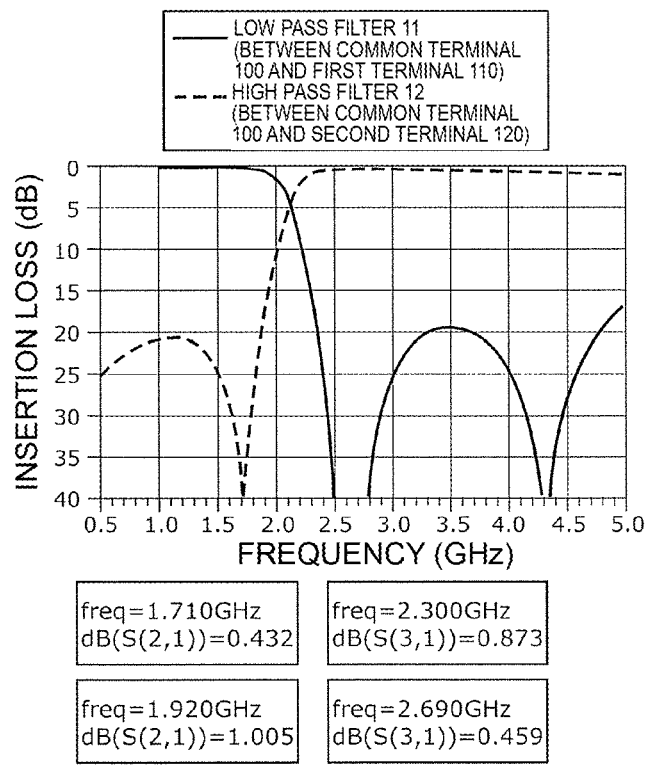
FIGS. 5BA and 5BB include a graph and a Smith chart indicating bandpass characteristics in the CA mode 1 of the multiplexer according to the Example 1.
Figure 5B:
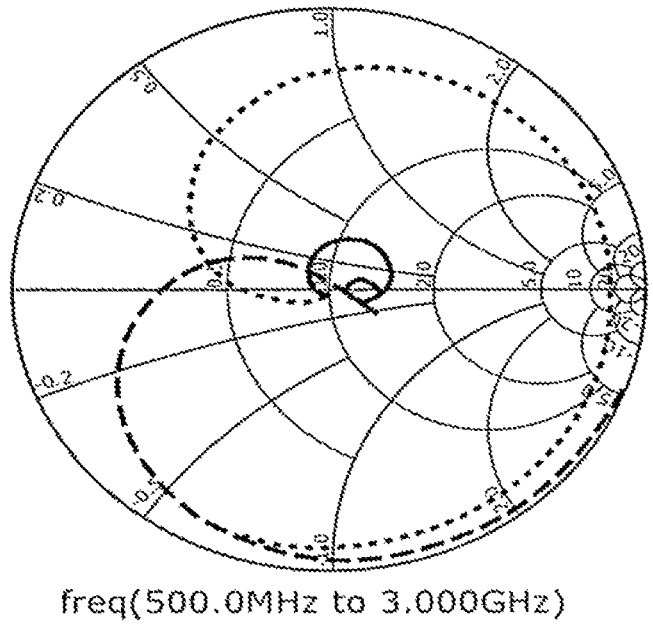
Figure 6B:
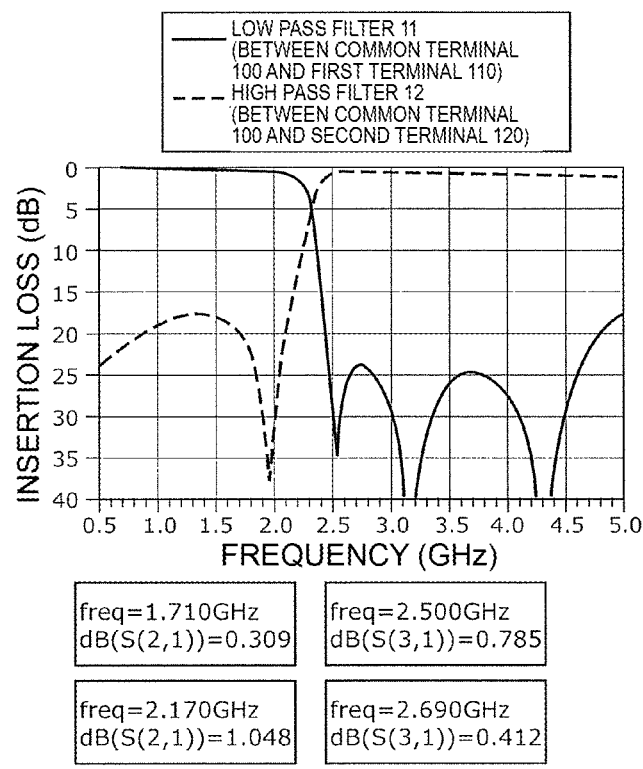
FIGS. 6BA and 6BB include a graph and a Smith chart indicating bandpass characteristics in the CA mode 2 of the multiplexer according to the Example 1.
Figure 6B:
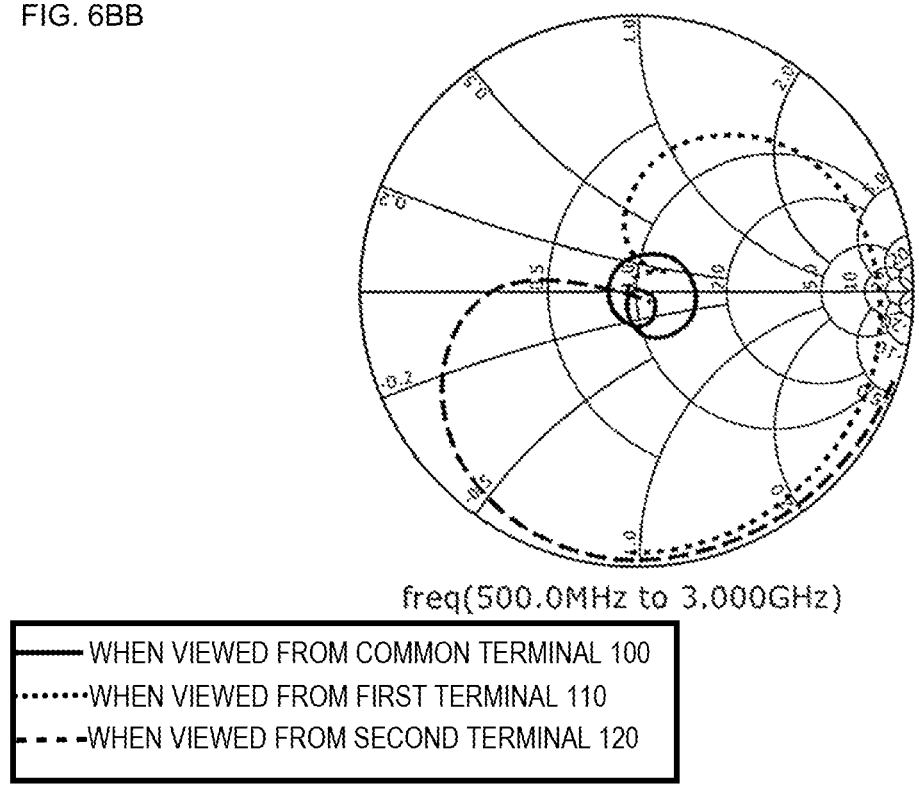
Figure 7B:
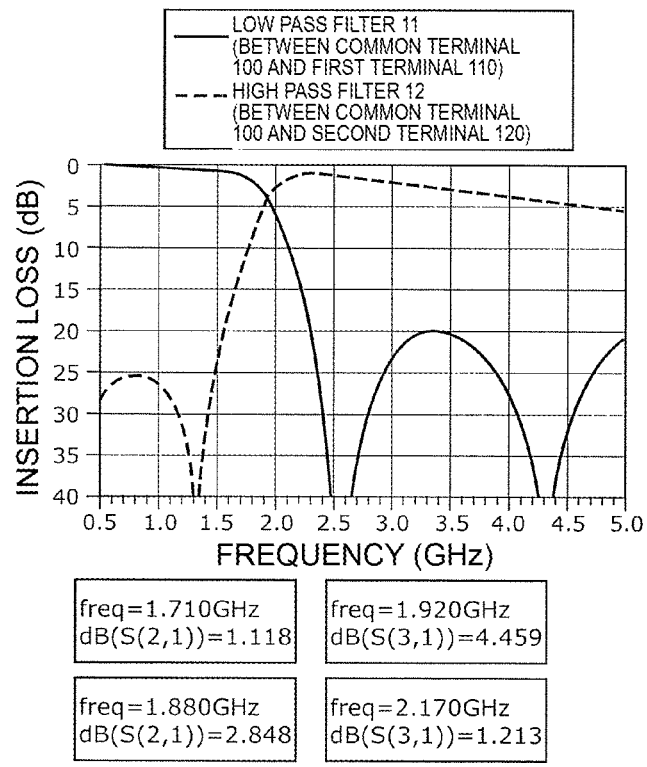
FIGS. 7BA and 7BB include a graph and a Smith chart indicating bandpass characteristics in the CA mode 3 of the multiplexer according to the Example 1.
Figure 7B:
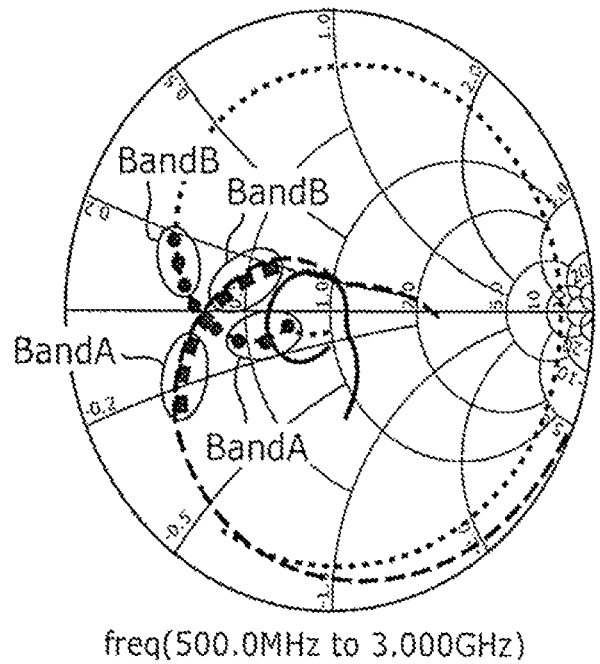

FIGS. 5BA and 5BB include a graph (FIG. 5BA) and a Smith chart (FIG. 5BB) indicating bandpass characteristics in the CA mode 1 of the multiplexer 10A according to the Example 1. FIGS. 6BA and 6BB include a graph (FIG. 6BA) and a Smith chart (FIG. 6BB) indicating bandpass characteristics in the CA mode 2 of the multiplexer 10A according to the Example 1. FIGS. 7BA and 7BB include a graph (FIG. 7BA) and a Smith chart (FIG. 7BB) indicating bandpass characteristics in the CA mode 3 of the multiplexer 10A according to the Example 1.

In the low pass filter 11A, the capacitor C24 is connected in series with the switch SW21. Therefore, even if the switch SW21 is in the conduction state, the first frequency variable circuit serves as an LC series resonant circuit including a parallel combined capacitor including the capacitors C21 and C24 and the inductor L21 and has a resonant point. Thus, an attenuation pole is generated (a solid line in FIG. 5BA). In contrast, when the switch SW21 is in the non-conduction state, the first frequency variable circuit serves as an LC series resonant circuit including the inductor L21 and the capacitor C21 and has a resonant point on a higher frequency side than the resonant point at the time when the switch SW21 is in conduction. Thus, an attenuation pole on a higher frequency side than the time when the switch SW21 is in conduction is generated (a solid line in FIG. 6BA). Accordingly, the first transition band of the low pass filter 11A is shifted toward higher frequencies compared to the time when the switch SW21 is in conduction.

That is, by causing the switch SW21 to be in conduction or not to be in conduction according to the frequency relationship of a band within the first frequency band and a band within the third frequency band that are used at the same time, the first transition band of the low pass filter 11A can be varied. Accordingly, as illustrated in FIG. 5BB, the impedance in the Band A and the Band C or D when the low pass filter 11A and the high pass filter 12A are viewed from the common terminal 100 can be set to a normalizing impedance. Furthermore, as illustrated in FIG. 6BB, the impedance in the Band A or B and the Band D when the low pass filter 11A and the high pass filter 12A are viewed from the common terminal 100 can be set to a normalizing impedance. Therefore, in the multiplexer 10A that executes CA of the first frequency band and the third frequency band, degradation in the insertion loss can be reduced even if a band to be selected changes.

In the high pass filter 12A, the capacitor C14 is connected in series with the switch SW11. Therefore, even if the switch SW11 is in the conduction state, the second frequency variable circuit serves as an LC series resonant circuit including a parallel combined capacitor including the capacitors C11 and C14 and the inductor L11 and has a resonant point. Thus, an attenuation pole is generated (a broken line in FIG. 5BA). In contrast, when the switch SW11 is not in conduction, the second frequency variable circuit serves as an LC series resonant circuit including the capacitor C11 and the inductor L11 and has a resonant point on a higher frequency side than the resonant point at the time when the switch SW11 is in conduction. Thus, an attenuation pole on a higher frequency side than the time when the switch SW11 is in conduction is generated (a broken line in FIG. 6BA). Accordingly, the second transition band of the high pass filter 12A is shifted toward higher frequencies compared the time when the switch SW11 is in conduction.

That is, by causing the switch SW11 to be in conduction or not to be in conduction according to the frequency relationship of a band within the first frequency band and a band within the third frequency band that are used at the same time, the second transition band of the high pass filter 12A can be varied. Accordingly, as illustrated in FIG. 5BB, the impedance in the Band A and the Band C or D when the low pass filter 11A and the high pass filter 12A are viewed from the common terminal 100 can be set to a normalizing impedance. Furthermore, as illustrated in FIG. 6BB, the impedance in the Band A or B and the Band D when the low pass filter 11A and the high pass filter 12A are viewed from the common terminal 100 can be set to a normalizing impedance. Therefore, in the multiplexer 10A that executes CA of the first frequency band and the third frequency band, degradation in the insertion loss can be reduced even if a band to be selected changes.

In contrast, as illustrated in FIG. 7A, in the case of the CA mode 3 in which the Band A and the Band B are used at the same time, the switches SW11 and SW21 are in the non-conduction state, and the switches SW12, SW22, and SW3 are in the conduction state. The boundary frequency width between the Band A and the Band B is smaller than the boundary frequency width between the Band A ad the Band C. Therefore, for CA of the Band A and the Band B, even if an overlapping frequency band in which the first transition band and the second transition band overlap is arranged in the boundary frequency band between the Band A and the Band B by the first frequency variable circuit and the second frequency variable circuit, insertion loss and demultiplexing characteristics in the two bands mentioned above degrade. Thus, the switches SW12, SW22, and SW3 of the impedance variable circuit 13A are in the conduction state. By causing the switches SW12 and SW22 to be in the conduction state, as illustrated in FIG. 7BA, the overlapping frequency band is arranged in the boundary frequency band between the Band A and the Band B and, as illustrated in FIG. 7BB, a complex conjugate relationship of the impedance of the low pass filter 11A when the common terminal 100 side is viewed from the first terminal 110 and the impedance of the high pass filter 12A when the common terminal 100 side is viewed from the second terminal 120 can be achieved. More specifically, the impedance in the Band A (for example, the Band 3), which is the pass band of the low pass filter 11A when the common terminal 100 side is viewed from the first terminal 110, and the impedance in the Band B (for example, the Band 1), which is the pass band of the high pass filter 12A when the common terminal 100 side is viewed from the second terminal 120, have a complex conjugate relationship, and the impedance in the Band B (for example, the Band 1), which is the attenuation band of the low pass filter 11A when the common terminal 100 side is viewed from the first terminal 110, and the impedance in the Band A (for example, the Band 3), which is the attenuation band of the high pass filter 12A when the common terminal 100 side is viewed from the second terminal 120, have a complex conjugate relationship.

Accordingly, the impedance of the low pass filter 11A when the common terminal 100 side is viewed from the first terminal 110 and the impedance of the high pass filter 12A when the common terminal 100 side is viewed from the second terminal 120 have a complex conjugate relationship both in the pass band and the attenuation band. Thus, complex conjugate matching between the low pass filter 11A and the high pass filter 12A can be achieved with high accuracy.

Furthermore, by causing the switch SW3 to be in the conduction state, the combined impedance of the impedance of the low pass filter 11A and the impedance of the high pass filter 12A, which have a complex conjugate relationship, can be matched to a normalizing impedance (for example, 50Ω) by the second impedance element. Therefore, degradation in the insertion loss in the pass band of the radio frequency circuit 20 in the case where the Band A and the Band B are used at the same time can be reduced.

In the case where the CA mode 3 is executed, depending on the setting of the capacitances of the capacitors C15, C25, and C30, similar operations and effects can be achieved even if the switches SW11 and SW21 are in the conduction state.

Figure 8A:
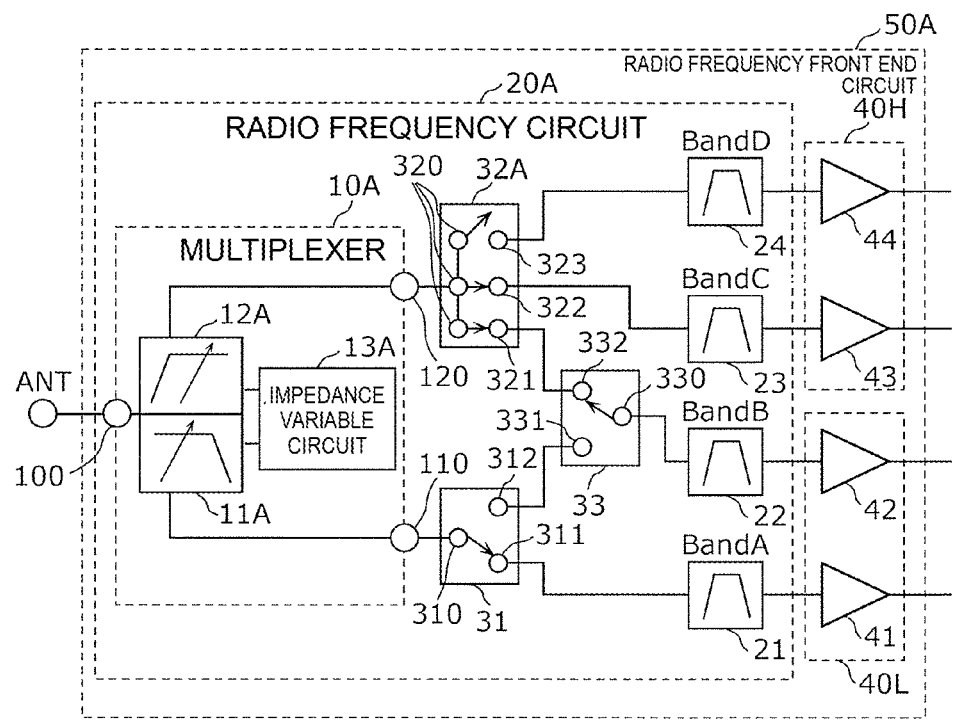
FIG. 8A is a circuit configuration diagram of a radio frequency front end circuit according to Example 2.

FIG. 8A is a circuit configuration diagram of a radio frequency front end circuit 50A according to Example 2. As illustrated in FIG. 8A, the radio frequency front end circuit 50A includes a radio frequency circuit 20A and reception amplifiers 41, 42, 43, and 44. The radio frequency circuit 20A includes a multiplexer 10A, switches 31, 32A, and 33, and filters 21, 22, 23, and 24. The radio frequency front end circuit 50A according to the Example 2 differs from the radio frequency front end circuit 50 according to the first embodiment in that the multiplexer 10A according to the Example 1 is arranged in place of the multiplexer 10 and the switch 32A is arranged in place of the switch 32. Explanation for the same configuration features in the radio frequency front end circuit 50A according to this example as those in the radio frequency front end circuit 50 according to the first embodiment will be omitted, and configuration features different from those of the radio frequency front end circuit 50 according to the first embodiment will be mainly explained.

The multiplexer 10A is the same as the multiplexer 10A according to the Example 1.

The switch 32A includes a common terminal 320 and selection terminals 321, 322, and 323, and the common terminal 320 is connected to the second terminal 120. The switch 32A includes an SPST switch that switches connection between the common terminal 320 and the selection terminal 321, an SPST switch that switches connection between the common terminal 320 and the selection terminal 322, and an SPST switch that switches connection between the common terminal 320 and the selection terminal 323. The switch 32A includes an SPST switch that switches connection between the common terminal 320 and the selection terminal 321, an SPST switch that switches connection between the common terminal 320 and the selection terminal 322, and an SPST switch that switches connection between the common terminal 320 and the selection terminal 323. With this configuration, the switch 32A is a switch circuit that is able to select at least one of connection between the common terminal 320 and the selection terminal 321, connection between the common terminal 320 and the selection terminal 322, and connection between the common terminal 320 and the selection terminal 323.

In this example, (i) CA of the Band A and the Band C can be executed by connecting the common terminal 310 with the selection terminal 311 and connecting the common terminal 320 with the selection terminal 322, (ii) CA of the Band A and the Band D can be executed by connecting the common terminal 310 with the selection terminal 311 and connecting the common terminal 320 with the selection terminal 323, (iii) CA of the Band B and the Band C can be executed by connecting the common terminal 310 with the selection terminal 312, connecting the common terminal 330 with the selection terminal 331, and connecting the common terminal 320 and the selection terminal 322, (iv) CA of the Band B and the Band D can be executed by connecting the common terminal 310 with the selection terminal 312, connecting the common terminal 330 with the selection terminal 331, and connecting the common terminal 320 with the selection terminal 323, (v) CA of the Band A and the Band B can be executed by connecting the common terminal 310 with the selection terminal 311, connecting the common terminal 320 with the selection terminal 321, and connecting the common terminal 330 with the selection terminal 332, (vi) 3CA of the Band A, the Band B, and the Band C can be executed by connecting the common terminal 310 with the selection terminal 311, connecting the common terminal 320 with the selection terminal 321, connecting the common terminal 330 with the selection terminal 332, and connecting the common terminal 320 with the selection terminal 322, and (vii) 3CA of the Band A, the Band B, and the Band D can be executed by connecting the common terminal 310 with the selection terminal 311, connecting the common terminal 320 with the selection terminal 321, connecting the common terminal 330 with the selection terminal 332, and connecting the common terminal 320 with the selection terminal 323.

Figure 8B:
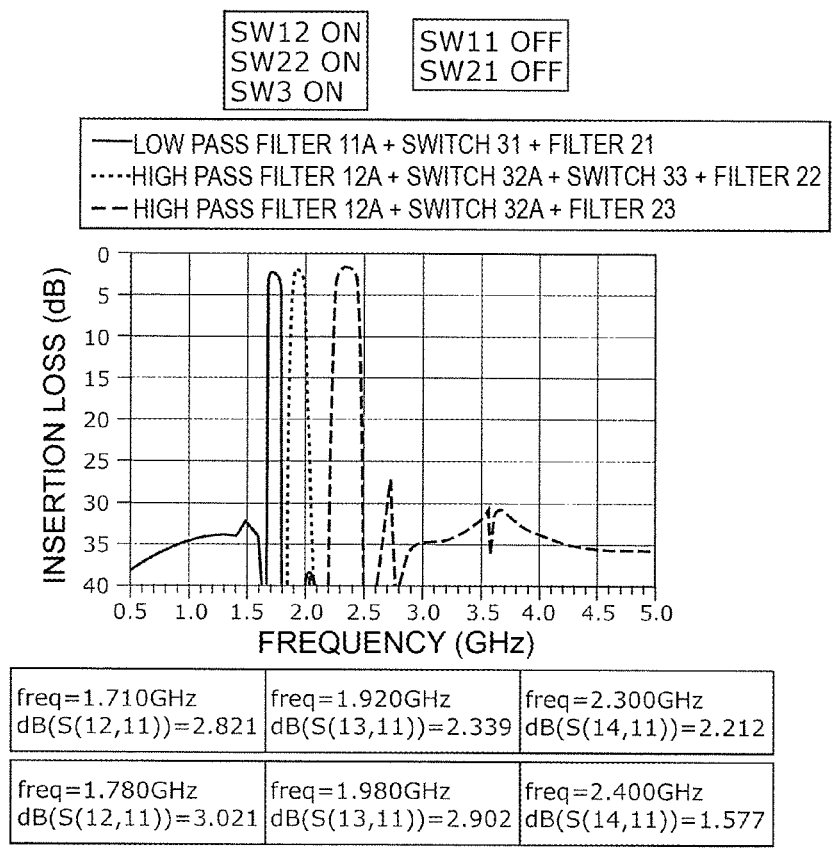
FIG. 8B is a graph indicating bandpass characteristics in 3CA of the radio frequency front end circuit according to the Example 2.

FIG. 8B is a graph indicating bandpass characteristics of (vi) 3CA of the radio frequency front end circuit 50A according to the Example 2. In FIG. 8B, bandpass characteristics between the common terminal 100 and the output terminal of the filter 21 (the low pass filter 11A, the switch 31, and the filter 21), bandpass characteristics between the common terminal 100 and the output terminal of the filter 22 (the high pass filter 12A, the switch 32A, the switch 33, and the filter 22), and bandpass characteristics between the common terminal 100 and the output terminal of the filter 23 (the high pass filter 12A, the switch 32A, and the filter 23) are illustrated.

In (vi) 3CA of the Band A, the Band B, and the Band C, as in FIG. 7A, the switches SW11 and SW21 are in the non-conduction state and the switches SW12, SW22, and SW3 are in the conduction state. By causing the switches SW12 and SW22 to be in the conduction state, an overlapping frequency band for the low pass filter 11A and the high pass filter 12A is arranged in a boundary frequency band between the Band A and the Band B, the impedance in the pass band (Band A) of the low pass filter 11A when the common terminal 100 side is viewed from the first terminal 110 and the impedance in the pass band (Band B) of the high pass filter 12A when the common terminal 100 side is viewed from the second terminal 120 have a complex conjugate relationship, and the impedance in the attenuation band (Band B) of the low pass filter 11A when the common terminal 100 side is viewed from the first terminal 110 and the impedance in the attenuation band (Band A) of the high pass filter 12A when the common terminal 100 side is viewed from the second terminal 120 have a complex conjugate relationship.

Furthermore, the overlapping frequency band for the low pass filter 11A and the high pass filter 12A is arranged in the boundary frequency band between the Band A and the Band B. Therefore, degradation in the band of the Band C caused by a low frequency end of the pass band of the high pass filter 12A can be reduced.

Accordingly, as illustrated in FIG. 8B, insertion loss in the Band A, the Band B, and the Band C of the radio frequency front end circuit 50A according to the Example 2 is reduced compared to insertion loss in the Band A, the Band B, and the Band C of the radio frequency front end circuit 551 according to the Comparative Example 2 illustrated in FIG. 4BB.

[1.4 Multiplexer According to Modifications]

Figure 9A:
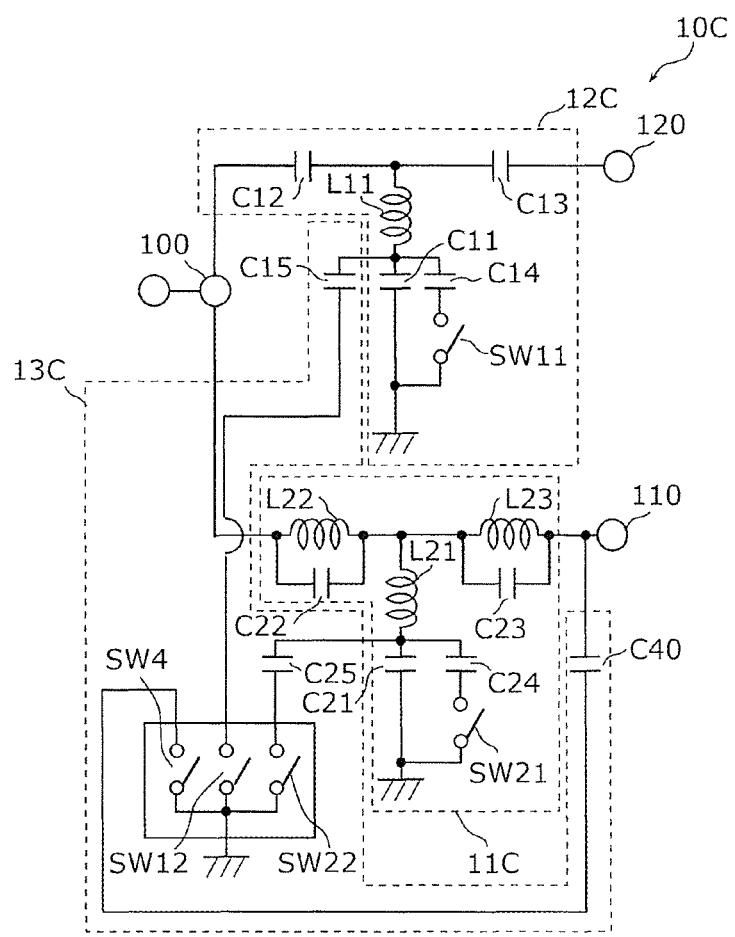
FIG. 9A is a circuit configuration diagram of a multiplexer according to a first modification of the first embodiment.

FIG. 9A is a circuit configuration diagram of a multiplexer 10C according to a first modification of the first embodiment. The multiplexer 10C according to this modification includes a common terminal 100, a first terminal 110, a second terminal 120, a low pass filter 11C, a high pass filter 12C, and an impedance variable circuit 13C. The multiplexer 10C according to the first modification differs from the multiplexer 10A according to the Example 1 only in the configuration of the impedance variable circuit 13C. The same configuration features in the multiplexer 10C according to this modification as those in the multiplexer 10A according to the Example 1 will be omitted, and different configuration features will be mainly explained.

The low pass filter 11C has the same circuit configuration as that of the low pass filter 11A according to the Example 1. The high pass filter 12C has the same circuit configuration as that of the high pass filter 12A according to the Example 1.

The impedance variable circuit 13C includes a capacitor C15 (first impedance element), a capacitor C25 (first impedance element), a capacitor C40, a switch SW12 (first switch element), a switch SW22 (first switch element), and a switch SW4.

A circuit including the capacitor C25 and the switch SW22 that are connected in series with each other is connected between a connection node between the inductor L21 and the capacitor C21 and the ground. Accordingly, in the case where the switch SW22 is in the conduction state, by adding a component of the capacitor C21 of the first frequency variable circuit to a component of the capacitor C25, the flexibility of the impedance variable width of the impedance variable circuit 13C is improved. Therefore, the impedance of the low pass filter 11C can be varied with high accuracy. Furthermore, the capacitor C25 can be miniaturized.

Furthermore, a circuit including the capacitor C15 and the switch SW12 that are connected in series with each other is connected between a connection node between the inductor L11 and the capacitor C11 and the ground. Accordingly, in the case where the switch SW12 is in the conduction state, by adding a component of the capacitor C11 of the second frequency variable circuit to a component of the capacitor C15, the flexibility of the impedance variable width of the impedance variable circuit 13C is improved. Therefore, the impedance of the high pass filter 12C can be varied with high accuracy. Furthermore, the capacitor C15 can be miniaturized.

Furthermore, a circuit including the capacitor C40 and the switch SW4 that are connected in series with each other is connected between the first terminal 110 and the ground. Accordingly, the impedance of the low pass filter 11C when the common terminal 100 side is viewed from the first terminal 110 can be finely adjusted. Therefore, complex conjugate matching between the impedance of the low pass filter 11C when the common terminal 100 side is viewed from the first terminal 110 and the impedance of the high pass filter 12C when the common terminal 100 side is viewed from the second terminal 120 can be achieved with high accuracy. Depending on requirement characteristics of the low pass filter 11C, an inductor may be arranged in place of the capacitor C40.

Figure 9B:
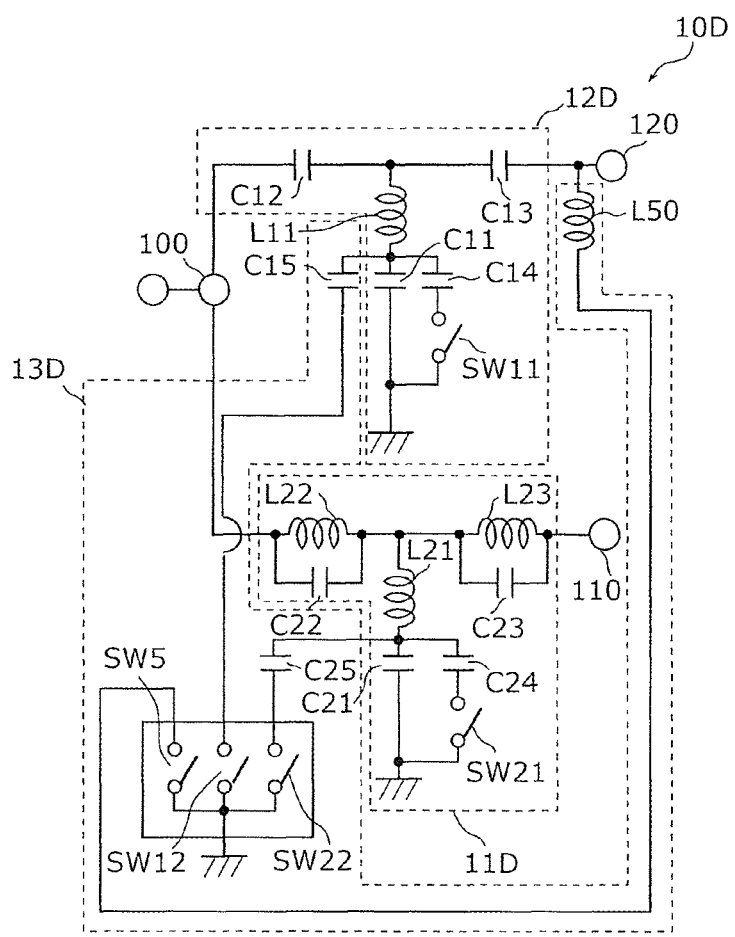
FIG. 9B is a circuit configuration diagram of a multiplexer according to a second modification of the first embodiment.

FIG. 9B is a circuit configuration diagram of a multiplexer 10D according to a second modification of the first embodiment. The multiplexer 10D according to this modification includes a common terminal 100, a first terminal 110, a second terminal 120, a low pass filter 11D, a high pass filter 12D, and an impedance variable circuit 13D. The multiplexer 10D according to the second modification differs from the multiplexer 10A according to the Example 1 only in the configuration of the impedance variable circuit 13D.

The same configuration features in the multiplexer 10D according to this modification as those in the multiplexer 10A according to the Example 1 will be omitted, and different configuration features will be mainly explained.

The low pass filter 11D has the same circuit configuration as that of the low pass filter 11A according to the Example 1. The high pass filter 12D has the same circuit configuration as that of the high pass filter 12A according to the Example 1.

The impedance variable circuit 13D includes a capacitor C15 (first impedance element), a capacitor C25 (first impedance element), an inductor L50, a switch SW12 (first switch element), a switch SW22 (first switch element), and a switch SW5.

A circuit including the capacitor C25 and the switch SW22 that are connected in series with each other is connected between a connection node between the inductor L21 and the capacitor C21 and the ground. Accordingly, in the case where the switch SW22 is in the conduction state, by adding a component of the capacitor C21 of the first frequency variable circuit to a component of the capacitor C25, the flexibility of the impedance variable width of the impedance variable circuit 13D is improved. Therefore, the impedance of the low pass filter 11D can be varied with high accuracy. Furthermore, the capacitor C25 can be miniaturized.

Furthermore, a circuit including the capacitor C15 and the switch SW12 that are connected in series with each other is connected between a connection node between the inductor L11 and the capacitor C11 and the ground. Accordingly, in the case where the switch SW12 is in the conduction state, by adding a component of the capacitor C11 of the second frequency variable circuit to a component of the capacitor C15, the flexibility of the impedance variable width of the impedance variable circuit 13D is improved. Therefore, the impedance of the high pass filter 12D can be varied with high accuracy. Furthermore, the capacitor C15 can be miniaturized.

Furthermore, a circuit including the inductor L50 and the switch SW5 that are connected in series with each other is connected between the second terminal 120 and the ground. Accordingly, the impedance of the high pass filter 12D when the common terminal 100 side is viewed from the second terminal 120 can be finely adjusted. Therefore, complex conjugate matching between the impedance of the low pass filter 11D when the common terminal 100 side is viewed from the first terminal 110 and the impedance of the high pass filter 12D when the common terminal 100 side is viewed from the second terminal 120 can be achieved with high accuracy. Depending on requirement characteristics of the high pass filter 12D, a capacitor may be arranged in place of the inductor L50.

Figure 9C:
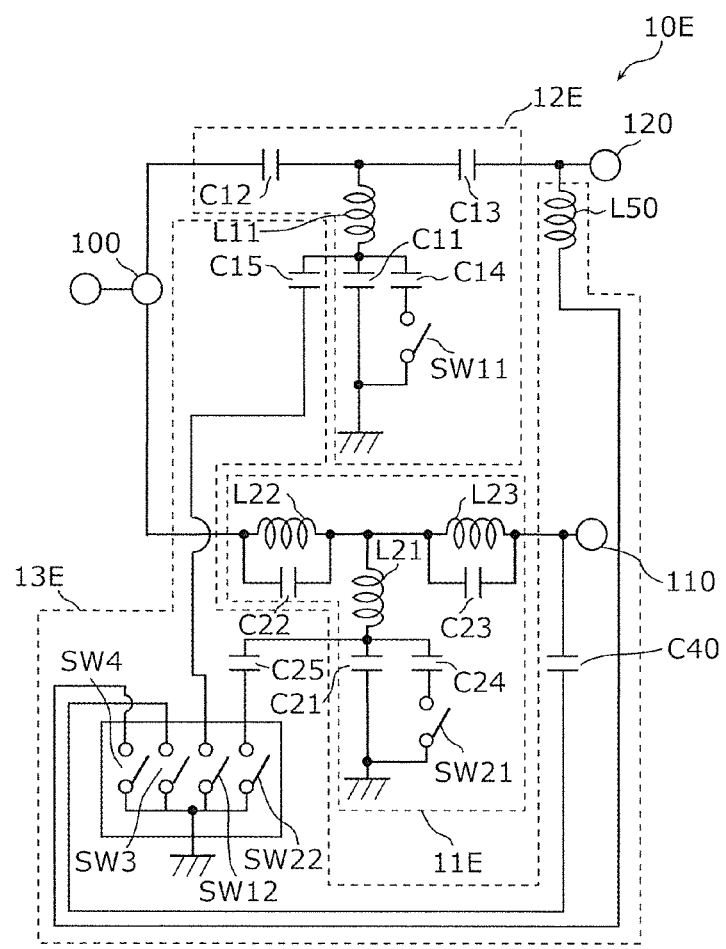
FIG. 9C is a circuit configuration diagram of a multiplexer according to a third modification of the first embodiment.

FIG. 9C is a circuit configuration diagram of a multiplexer 10E according to a third modification of the first embodiment. The multiplexer 10E according to this modification includes a common terminal 100, a first terminal 110, a second terminal 120, a low pass filter 11E, a high pass filter 12E, and an impedance variable circuit 13E. The multiplexer 10E according to the third modification differs from the multiplexer 10A according to the Example 1 only in the configuration of the impedance variable circuit 13E. The same configuration features in the multiplexer 10E according to this modification as those in the multiplexer 10A according to the Example 1 will be omitted, and different configuration features will be mainly explained.

The low pass filter 11E has the same circuit configuration as that of the low pass filter 11A according to the Example 1. The high pass filter 12E has the same circuit configuration as that of the high pass filter 12A according to the Example 1.

The low pass filter 11E includes inductors L22 and L23 that are arranged in series with each other on a path that connects the common terminal 100 to the first terminal 110 and a first frequency variable circuit that is connected to the path. The first frequency variable circuit includes an LC series circuit including the inductor L21 and the capacitor C21 that are connected in series with each other and a switch SW21 (second switch element) that is connected to the LC series circuit. The switch SW21 is connected between a connection node between the inductor L21 and the capacitor C21 and the ground.

According to conduction or non-conduction of the switch SW21, the first transition band for transition from the first frequency band to the second frequency band can be varied.

The high pass filter 12E includes capacitors C12 and C13 that are arranged in series with each other on a path that connects the common terminal 100 to the second terminal 120 and a second frequency variable circuit that is connected to the path. The second frequency variable circuit includes an LC series circuit including the inductor L11 and the capacitor C11 that are connected in series with each other and a switch SW11 (third switch element) that is connected to the LC series circuit. The switch SW11 is connected between a connection node between the inductor L11 and the capacitor C11 and the ground.

According to conduction or non-conduction of the switch SW11, the second transition band for transition from the third frequency band to the fourth frequency band can be varied.

The impedance variable circuit 13E includes a capacitor C15 (third impedance element), a capacitor C25 (first impedance element), a capacitor C40 (second impedance element), an inductor L50 (fourth impedance element) a switch SW12 (first switch element), a switch SW22 (first switch element), a switch SW3 (first switch element), and a switch SW4 (first switch element).

One end of the capacitor C25 is connected to the connection node between the inductor L21 and the capacitor C21. One end of the capacitor C40 is connected to the first terminal 110. One end of the capacitor C15 is connected to the connection node between the inductor L11 and the capacitor C11. One end of the inductor L50 is connected to the second terminal 120. The switch SW22 is connected between the other end of the capacitor C25 and the ground. The switch SW3 is connected between the other end of the capacitor C40 and the ground. The switch SW12 is connected between the other end of the capacitor C15 and the ground. The switch SW4 is connected between the other end of the inductor L50 and the ground.

With the circuit including the capacitor C25 and the switch SW22 that are connected in series with each other, in the case where the switch SW22 is in the conduction state, by adding a component of the capacitor C21 of the first frequency variable circuit to a component of the capacitor C25, the flexibility of the impedance variable width of the impedance variable circuit 13E is improved. Therefore, the impedance of the low pass filter 11E can be varied with high accuracy. Furthermore, the capacitor C25 can be miniaturized.

Furthermore, with the circuit including the capacitor C15 and the switch SW12 that are connected in series with each other, in the case where the switch SW12 is in the conduction state, by adding a component of the capacitor C11 of the second frequency variable circuit to a component of the capacitor C15, the flexibility of the impedance variable width of the impedance variable circuit 13E is improved. Therefore, the impedance of the high pass filter 12E can be varied with high accuracy. Furthermore, the capacitor C15 can be miniaturized.

Furthermore, with the circuit including the capacitor C40 and the switch SW3 that are connected in series with each other, the impedance of the low pass filter 11E when the common terminal 100 side is viewed from the first terminal 110 can be finely adjusted. Furthermore, with the circuit including the inductor L50 and the switch SW4 that are connected in series with each other, the impedance of the high pass filter 12E when the common terminal 100 side is viewed from the second terminal 120 can be finely adjusted. Therefore, complex conjugate matching between the impedance of the low pass filter 11E when the common terminal 100 side is viewed from the first terminal 110 and the impedance of the high pass filter 12E when the common terminal 100 side is viewed from the second terminal 120 can be achieved with high accuracy.

With the configuration according to this modification, in the case where the first pass band and the third pass band for which the boundary frequency width is narrow are used at the same time, according to the conduction state or the non-conduction state of the switches SW12, SW22, SW3, and SW4, the impedance of the low pass filter 11E when the common terminal 100 side is viewed from the first terminal 110 and the impedance of the high pass filter 12E when the common terminal 100 side is viewed from the second terminal 120 have a complex conjugate relationship. Therefore, complex conjugate matching between the low pass filter 11E and the high pass filter 12E can be achieved, and degradation in the insertion loss of the pass band of the radio frequency circuit in the case where the first pass band and the third pass band are used at the same time can thus be reduced. Consequently, in the radio frequency circuit in which CA of two frequency bands with a narrow frequency interval is executed, degradation in the insertion loss can be reduced.

In the multiplexer 10E according to this modification, at least one of the switches SW12, SW22, SW3, and SW4 may be arranged. That is, a first switch element may be connected between at least one of the other end of the capacitor C15, the other end of the capacitor C25, the other end of the capacitor C40, and the other end of the inductor L50 and the ground, and a remaining other end that is different from the at least one of the other end of the capacitor C15, the other end of the capacitor C25, the other end of the capacitor C40, and the other end of the inductor L50 may be connected to the ground.

With this arrangement, according to the conduction state or the non-conduction state of at least one of the switches SW12, SW22, SW3, and SW4, complex conjugate matching between the low pass filter 11E and the high pass filter 12E can be achieved. Therefore, degradation in the insertion loss in the pass band of the radio frequency circuit in the case where the first pass band and the third pass band are used at the same time can be reduced. Consequently, in the radio frequency circuit in which CA of two frequency bands with a narrow frequency interval is executed, degradation in the insertion loss can be reduced.

Figure 9D:
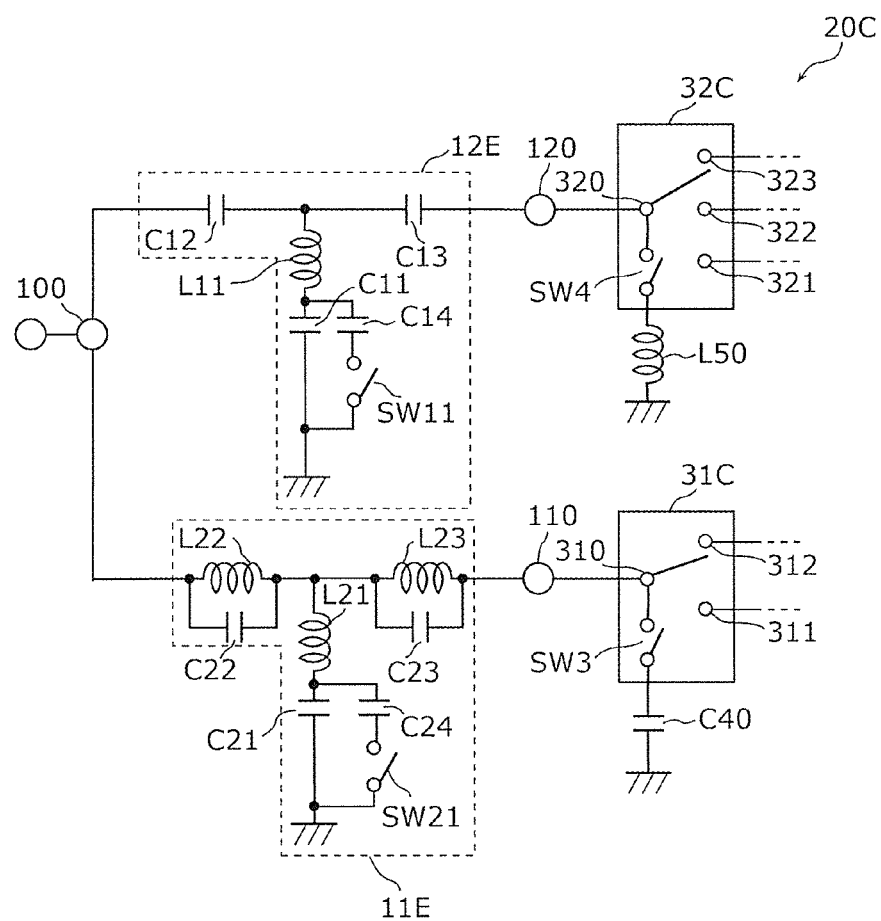
FIG. 9D is a circuit configuration diagram of a radio frequency circuit according to a fourth modification of the first embodiment.

FIG. 9D is a circuit configuration diagram of a radio frequency circuit 20C according to a fourth modification of the first embodiment. The radio frequency circuit 20C according to this modification includes a common terminal 100, a first terminal 110, a second terminal 120, a low pass filter 11E, a high pass filter 12E, filters 21 to 24 (not illustrated in FIG. 9D), switches 31C, 32C, and 33 (not illustrated in FIG. 9D), an inductor L50, and a capacitor C40. The radio frequency circuit 20C according to the fourth modification differs from the radio frequency circuit 20 according to the first embodiment in that the switch SW3 and the capacitor C40 connected to the first terminal 110 and the switch SW4 and the inductor L50 connected to the second terminal 120 are arranged in place of the impedance variable circuit 13. Explanation for the same configuration features in the radio frequency circuit 20C according to this modification as those in the radio frequency circuit 20 according to the first embodiment will be omitted, and different configuration features will be mainly explained.

The low pass filter 11E has the same circuit configuration as that of the low pass filter 11A according to the Example 1. The high pass filter 12E has the same circuit configuration as that of the high pass filter 12A according to the Example 1.

The filter 21 is connected to the selection terminal 311 of the switch 31C. The filter 22 is connected to the selection terminal 312 of the switch 31C and the selection terminal 321 of the switch 32C with the switch 33 interposed therebetween. The filter 23 is connected to the selection terminal 322 of the switch 32C. The filter 24 is connected to the selection terminal 323 of the switch 32C.

The switch 31C is a first switch circuit that includes a common terminal 310 (first common terminal) and two or more selection terminals 311 and 312, and the common terminal 310 is the same as the first terminal 110. The switch 31C switches connection between the first terminal 110 and the filter 21 and connection between the first terminal 110 and the filter 22.

The switch 32C is a second switch circuit that includes a common terminal 320 (second common terminal) and two or more selection terminals 321, 322, and 323, and the common terminal 320 is the same as the second terminal 120. The switch 32C switches connection between the second terminal 120 and the filter 23 and connection between the second terminal 120 and the filter 22.

A circuit including the capacitor C40 (first impedance element) and the switch SW3 (first switch element) that are connected in series with each other is connected between the first terminal 110 and the ground. The switch SW3 is built in the switch 31C.

A circuit including the inductor L50 (second impedance element) and the switch SW4 (fourth switch element) that are connected in series with each other is connected between the second terminal 120 and the ground. The switch SW4 is built in the switch 32C.

With the configuration according to this modification, in the case where the first pass band and the third pass band for which the boundary frequency width is narrow are used at the same time, according to the conduction state or the non-conduction state of the switches SW3 and SW4, the impedance of the low pass filter 11E when the common terminal 100 side is viewed from the first terminal 110 and the impedance of the high pass filter 12E when the common terminal 100 side is viewed from the second terminal 120 have a complex conjugate relationship. Accordingly, complex conjugate matching between the low pass filter 11E and the high pass filter 12E can be achieved. Therefore, degradation in the insertion loss in the pass band of the radio frequency circuit in the case where the first pass band and the third pass band are used at the same time can be reduced. Thus, in the radio frequency circuit in which CA of two frequency bands with a narrow frequency interval is executed, degradation in the insertion loss can be reduced.

Furthermore, a series connection circuit including the capacitor C40 (first impedance element) and the switch SW3 (first switch element) is arranged between the low pass filter 11E and the filters 21 and 22. Therefore, this series connection circuit further includes a function for implementing impedance matching between the low pass filter 11E and the filter 21 or 22, according to the combination of frequency bands for which CA is to be executed.

Furthermore, a series connection circuit including the inductor L50 (second impedance element) and the switch SW4 (fourth switch element) is arranged between the high pass filter 12E and the filters 22, 23, and 24. Therefore, this series connection circuit further includes a function for implementing impedance matching between the high pass filter 12E and the filter 22, 23, or 24, according to the combination of frequency bands for which CA is to be executed.

Second Embodiment

In this embodiment, a radio frequency front end circuit 50B that is able to execute 3CA of the Band A, the Band B, and the Band C and 3CA of the Band A, the Band B, and the Band D and has a circuit configuration different from that of the radio frequency front end circuit 50A according to the first embodiment will be explained.

Figure 10A:
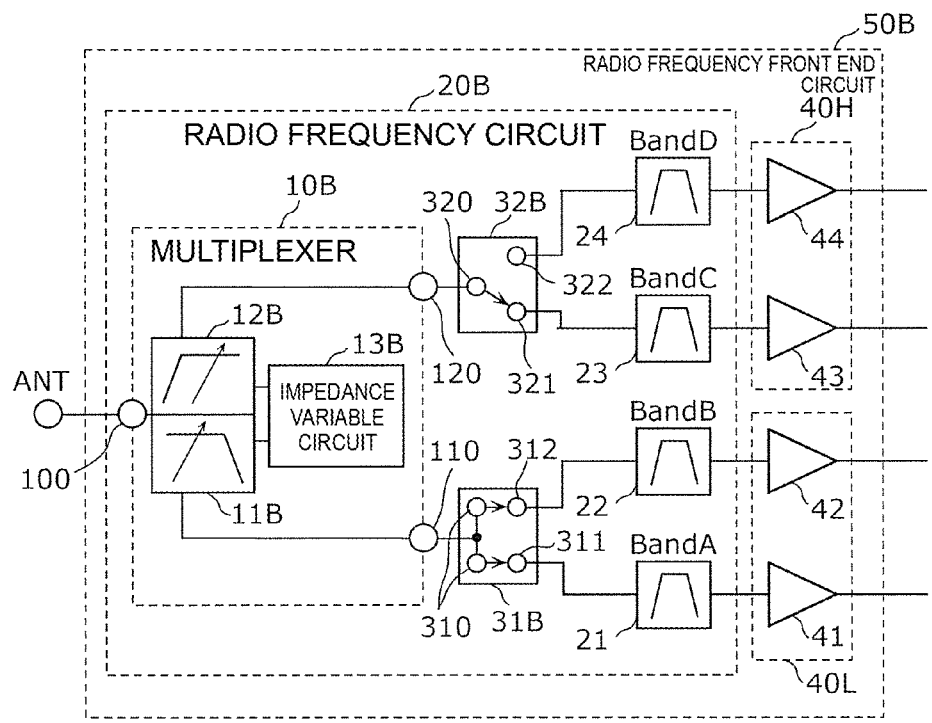
FIG. 10A is a circuit configuration diagram of a radio frequency front end circuit according to a second embodiment.

FIG. 10A is a circuit configuration diagram of the radio frequency front end circuit 50B according to the second embodiment. As illustrated in FIG. 10A, the radio frequency front end circuit 50B includes a radio frequency circuit 20B and reception amplifiers 41, 42, 43, and 44. The radio frequency circuit 20B includes a multiplexer 10B, switches 31B and 32B, and filters 21, 22, 23, and 24. The radio frequency front end circuit 50B according to the second embodiment differs from the radio frequency front end circuit 50A according to the first embodiment in that the multiplexer 10B is arranged in place of the multiplexer 10A and the switches 31B and 32B are arranged in place of the switches 31, 32A, and 33. Explanation for the same configuration features in the radio frequency front end circuit 50B according to this embodiment as those in the radio frequency front end circuit 50A according to the first embodiment will be omitted, and different configuration features will be mainly explained.

The multiplexer 10B is the same as the multiplexer 10A according to the first embodiment.

The switch 32B includes a common terminal 320 and selection terminals 321 and 322, and the common terminal 320 is connected to the second terminal 120. The switch 32B is an SPDT switch circuit in which the common terminal 320 may be connected to one of the selection terminals 321 and 322. The switch 32B may have a circuit configuration in which two SPST switches are arranged in parallel with each other. Furthermore, the switch 32B may be a switch circuit such as SP3T or SP4T. In this case, a common terminal and a necessary selection terminal may be used.

The switch 31B includes a common terminal 310 and selection terminals 311 and 312, and the common terminal 310 is connected to the first terminal 110. The switch 31B includes an SPST switch that switches connection between the common terminal 310 and the selection terminal 311 and an SPST switch that switches connection between the common terminal 310 and the selection terminal 312. With this configuration, the switch 31B is a switch circuit that is able to select at least one of connection between the common terminal 310 and the selection terminal 311 and connection between the common terminal 310 and the selection terminal 312.

In this embodiment, (i) CA of the Band A and the Band C can be executed by connecting the common terminal 310 with the selection terminal 311 and connecting the common terminal 320 with the selection terminal 321, (ii) CA of the Band A and the Band D can be executed by connecting the common terminal 310 with the selection terminal 311 and connecting the common terminal 320 with the selection terminal 322, (iii) CA of the Band B and the Band C can be executed by connecting the common terminal 310 with the selection terminal 312 and connecting the common terminal 320 with the selection terminal 321, (iv) CA of the Band B and the Band D can be executed by connecting the common terminal 310 with the selection terminal 312 and connecting the common terminal 320 with the selection terminal 322, (v) 3CA of the Band A, the Band B, and the Band C by connecting the common terminal 310 with the selection terminal 311, connecting the common terminal 310 with the selection terminal 312, and connecting the common terminal 320 with the selection terminal 321, and (vi) 3CA of the Band A, the Band B, and the Band D can be executed by connecting the common terminal 310 with the selection terminal 311, connecting the common terminal 310 with the selection terminal 312, and connecting the common terminal 320 with the selection terminal 322.

Figure 11A:
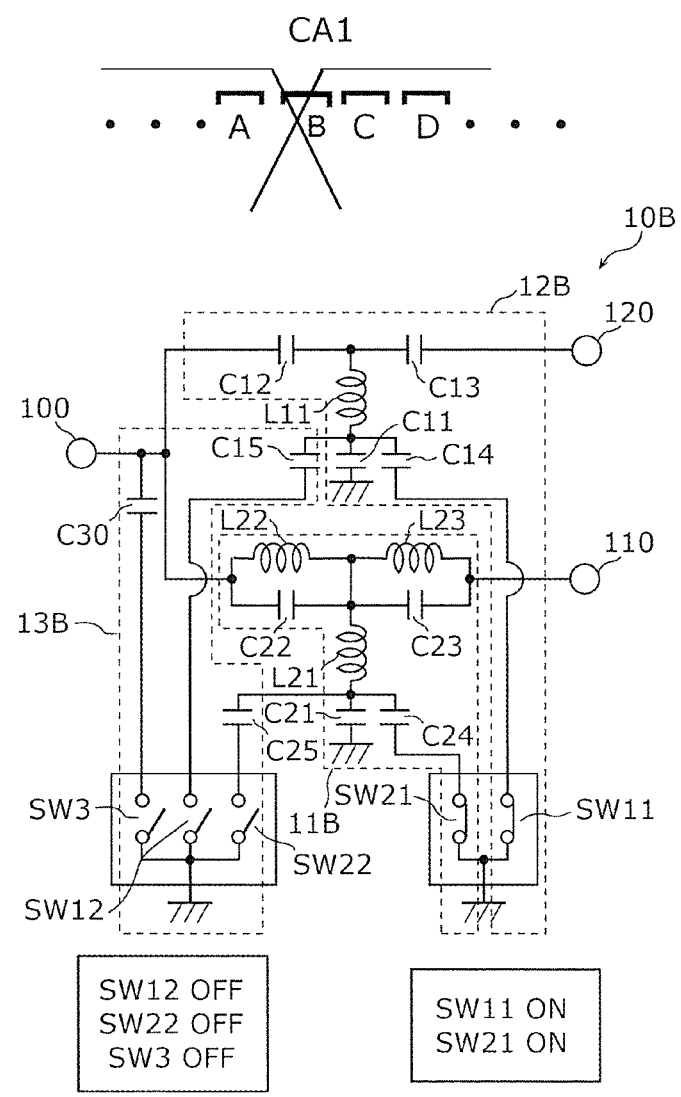
FIG. 11A is a circuit configuration diagram in a CA mode 1 of a multiplexer according to the second embodiment.
Figure 12A:
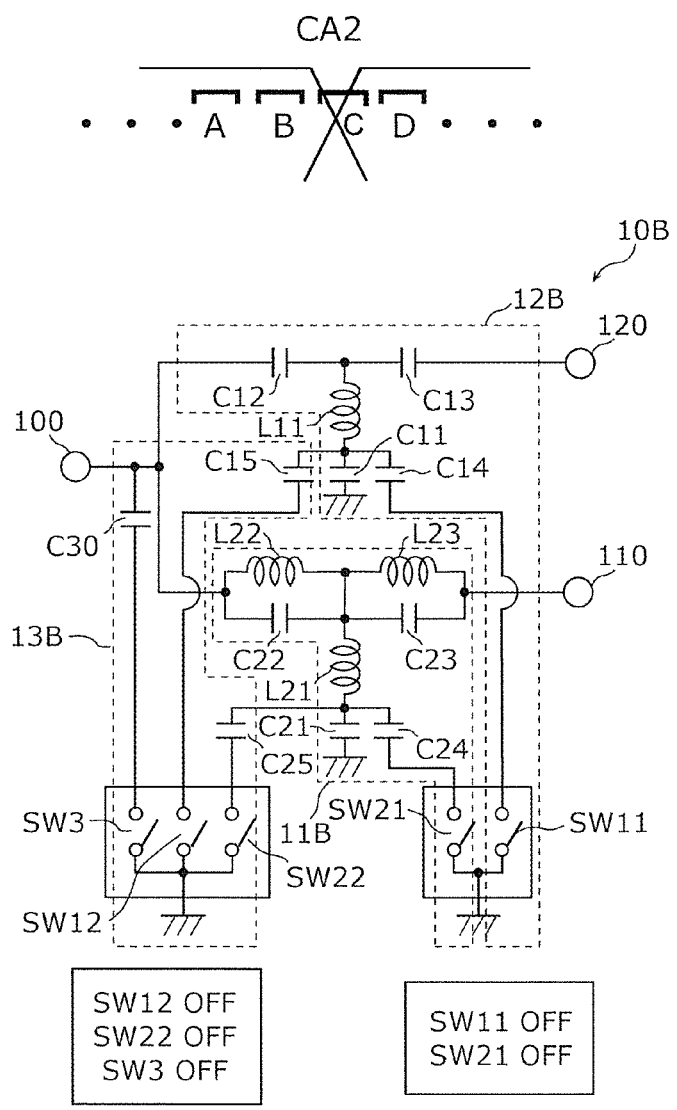
FIG. 12A is a circuit configuration diagram in a CA mode 2 of the multiplexer according to the second embodiment.
Figure 13A:
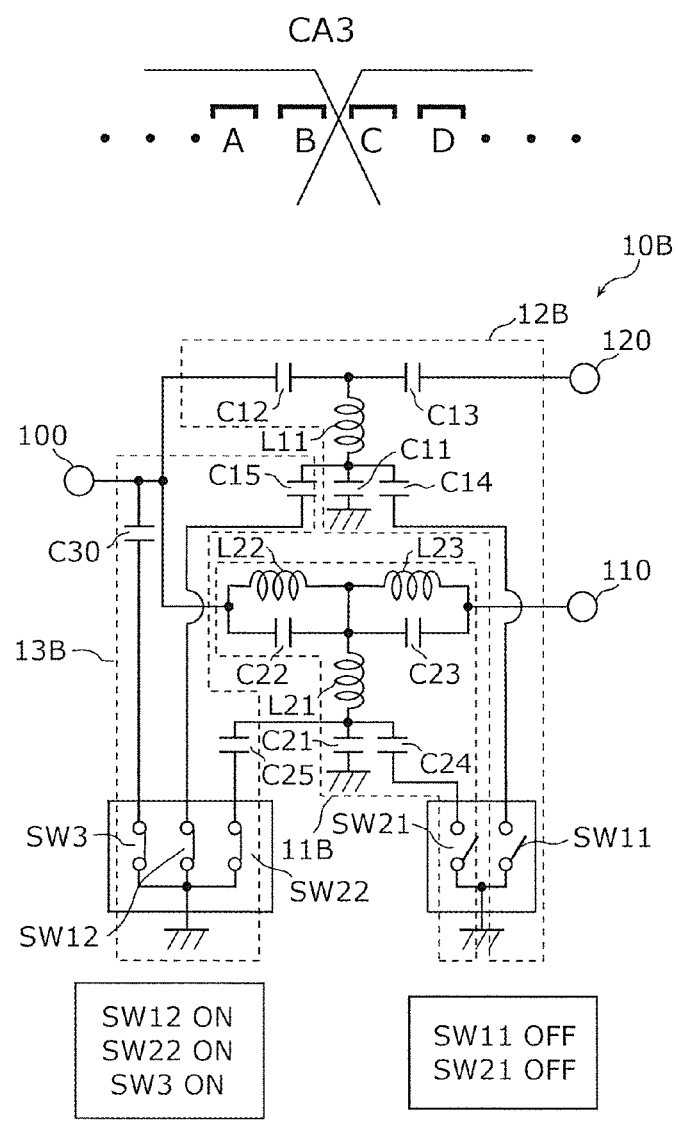
FIG. 13A is a circuit configuration diagram in a CA mode 3 of the multiplexer according to the second embodiment.

FIG. 11A is a circuit configuration diagram in the CA mode 1 of the multiplexer 10B according to the second embodiment. FIG. 12A is a circuit configuration diagram in the CA mode 2 of the multiplexer 10B according to the second embodiment. FIG. 13A is a circuit configuration diagram in the CA mode 3 of the multiplexer 10B according to the second embodiment.

With the circuit configuration mentioned above, (1) in the case of the CA mode 1 in which the Band A and the Band C or D are used at the same time, as illustrated in FIG. 11A, the switch SW11 and the switch SW21 are in the conduction state, and the switches SW12, SW22, and SW3 are in the non-conduction state, (2) in the case of the CA mode 2 in which the Band A or B and the Band D are used at the same time, as illustrated in FIG. 12A, the switches SW11 and SW21 are in the non-conduction state, and the switches SW12, SW22, and SW3 are in the non-conduction state, and (3) in the case of the CA mode 3 (3CA) in which the Band A, the Band B, and the Band C or D are used at the same time, as illustrated in FIG. 13A, the switches SW11 and SW21 are in the non-conduction state, and the switches SW12, SW22, and SW3 are in the conduction state. That is, in the case where a radio frequency signal of the Band A and a radio frequency signal of the Band B are transmitted at the same time, the switches SW12 and SW22 are in the conduction state, and in the case where a radio frequency signal of the Band A and a radio frequency signal of the Band B are transmitted exclusively from each other, the switches SW12 and SW22 are in the non-conduction state. With this arrangement, in the case where the Band A and the Band B for which the boundary frequency width is narrow are used at the same time, by causing the switches SW12 and SW22 to be in the conduction state, complex conjugate matching between the impedance of a low pass filter 11B when the common terminal 100 side is viewed from the first terminal 110 and the impedance of a high pass filter 12B when the common terminal 100 side is viewed from the second terminal 120 can be achieved. In contrast, in the case where the Band A or B and the Band D for which the boundary frequency width is wide are used at the same time and in the case where the Band A and the Band C or D for which the boundary frequency width is wide are used at the same time, by causing the switches SW12 and SW22 to be in the non-conduction state, for example, each of the impedance of the low pass filter 11B when the common terminal 100 side is viewed from the first terminal 110 and the impedance of the high pass filter 12B when the common terminal 100 side is viewed from the second terminal 120 can be matched to a normalizing impedance.

Figure 11B:
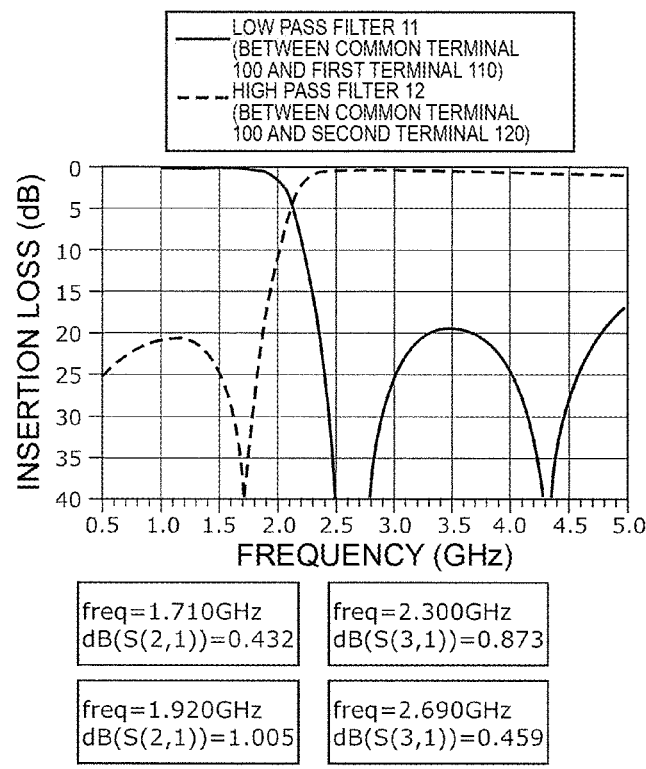
FIGS. 11BA and 11BB include a graph and a Smith chart indicating bandpass characteristics in the CA mode 1 of the multiplexer according to the second embodiment.
Figure 11B:
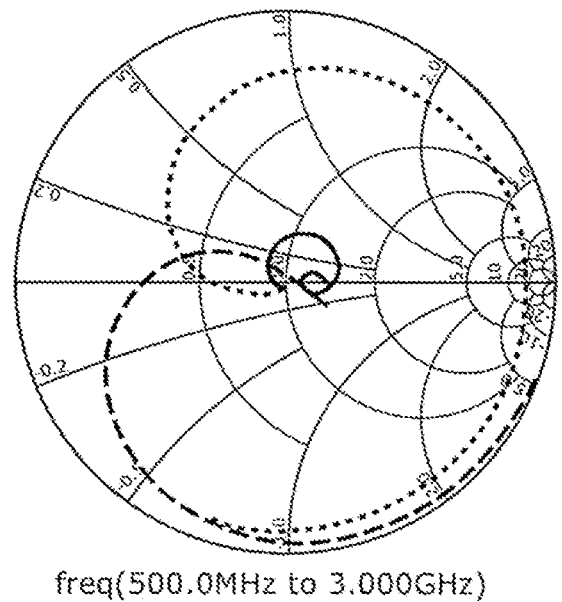
Figure 12B:
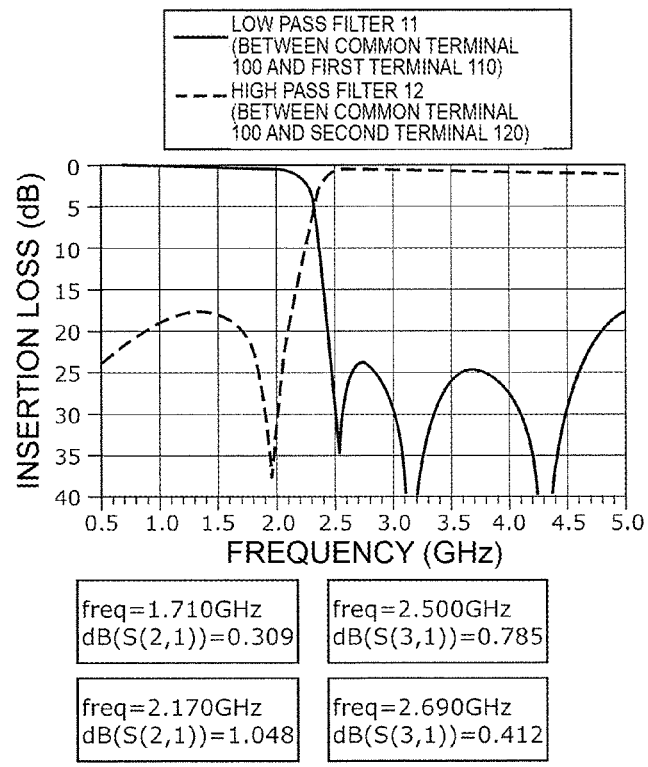
FIGS. 12BA and 12BB include a graph and a Smith chart indicating bandpass characteristics in the CA mode 2 of the multiplexer according to the second embodiment.
Figure 12B:
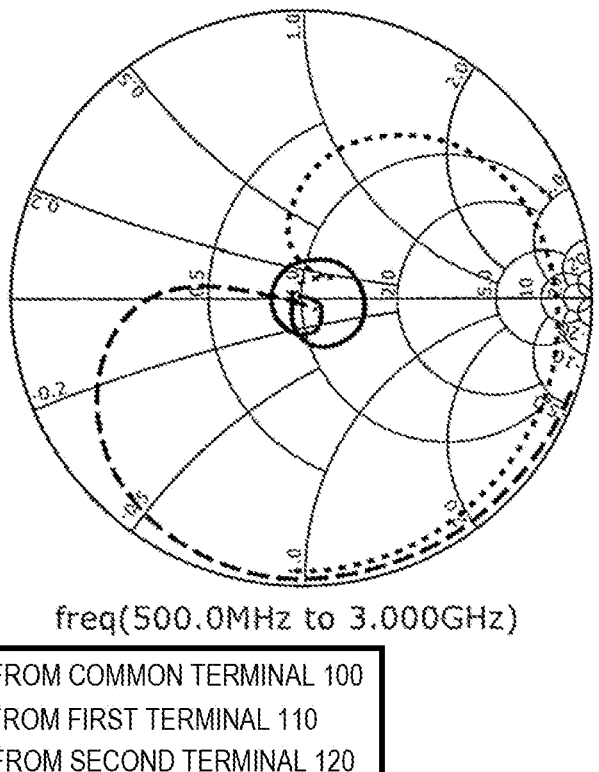
Figure 13B:
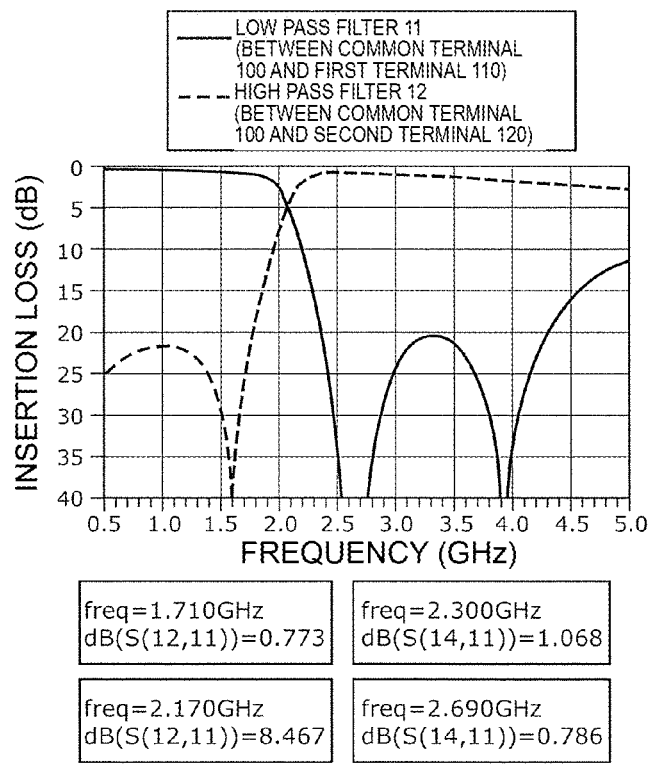
FIGS. 13BA and 13BB include a graph and a Smith chart indicating bandpass characteristics in the CA mode 3 of the multiplexer according to the second embodiment.
Figure 13B:
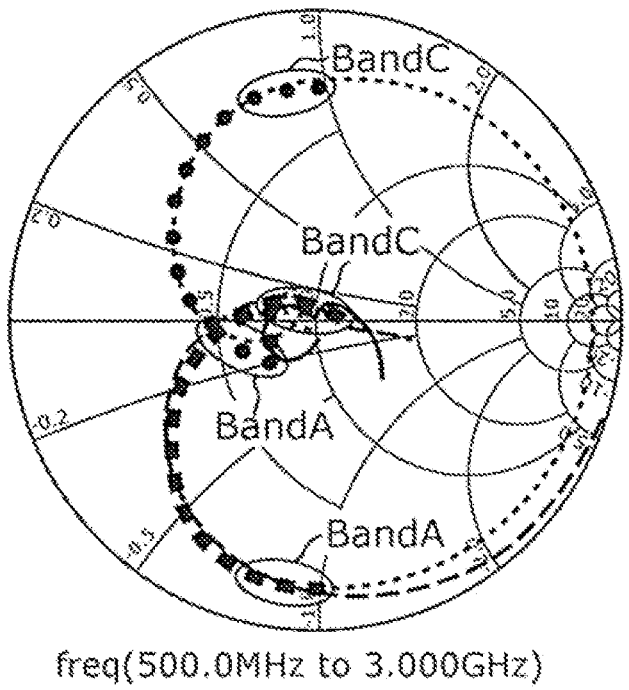

FIGS. 11BA and 11BB include a graph (FIG. 11BA) and a Smith chart (FIG. 11BB) indicating bandpass characteristics in the CA mode 1 of the multiplexer 10B according to the second embodiment. FIGS. 12BA and 12BB include a graph (FIG. 12BA) and a Smith chart (FIG. 12BB) indicating bandpass characteristics in the CA mode 2 of the multiplexer 10B according to the second embodiment. FIGS. 13BA and 13BB include a graph (FIG. 13BA) and a Smith chart (FIG. 13BB) indicating bandpass characteristics in the CA mode 3 of the multiplexer 10B according to the second embodiment.

In the low pass filter 11B, the capacitor C24 is connected in series with the switch SW21. Therefore, even if the switch SW21 is in the conduction state, the first frequency variable circuit serves as an LC series resonant circuit including a parallel combined capacitor including the capacitors C21 and C24 and the inductor L21 and has a resonant point. Thus, an attenuation pole is generated (a solid line in FIG. 11BA). In contrast, when the switch SW21 is not in conduction, the first frequency variable circuit serves as an LC series resonant circuit including the inductor L21 and the capacitor C21 and has a resonant point on a higher frequency side than the resonant point at the time when the switch SW21 is in conduction. Thus, an attenuation pole on a higher frequency side than the time when the switch SW21 is in conduction is generated (a solid line in FIG. 12BA). Accordingly, the first transition band of the low pass filter 11B is shifted toward higher frequencies compared to the time when the switch SW21 is in conduction.

That is, by causing the switch SW21 to be in conduction or not to be in conduction according to the frequency relationship of a band within the first frequency band and a band within the third frequency band that are used at the same time, the first transition band of the low pass filter 11B can be varied. Accordingly, as illustrated in FIG. 11BB, the impedance in the Band A and the Band C or D when the low pass filter 11B and the high pass filter 12B are viewed from the common terminal 100 can be set to a normalizing impedance (for example, 50Ω). Furthermore, as illustrated in FIG. 12BB, the impedance in the Band A or B and the Band D when the low pass filter 11B and the high pass filter 12B are viewed from the common terminal 100 can be set to a normalizing impedance. Therefore, in the multiplexer 10B that executes CA of the first frequency band and the third frequency band, degradation in the insertion loss can be reduced even if a band to be selected changes.

In the high pass filter 12B, the capacitor C14 is connected in series with the switch SW11. Therefore, even if the switch SW11 is in the conduction state, the second frequency variable circuit serves as an LC series resonant circuit including a parallel combined capacitor including the capacitors C11 and C14 and the inductor L11 and has a resonant point. Thus, an attenuation pole is generated (a broken line in FIG. 11BA). In contrast, when the switch SW11 is not in conduction, the second frequency variable circuit serves as an LC series resonant circuit including the capacitor C11 and the inductor L11 and has a resonant point on a higher frequency side than the resonant point at the time when the switch SW11 is in conduction. Thus, an attenuation pole on a higher frequency side than the time when the switch SW11 is in conduction is generated (a broken line in FIG. 12BA). Accordingly, the first transition band of the high pass filter 12B is shifted toward higher frequencies compared to the time when the switch SW11 is in conduction.

That is, by causing the switch SW11 to be in conduction or not to be in conduction according to the frequency relationship of a band within the first frequency band and a band within the third frequency band that are used at the same time, the second transition band of the high pass filter 12B can be varied. Accordingly, as illustrated in FIG. 11BB, the impedance in the Band A and the Band C or D when the low pass filter 11B and the high pass filter 12B are viewed from the common terminal 100 can be set to a normalizing impedance (for example, 50Ω). Furthermore, as illustrated in FIG. 12BB, the impedance in the Band A or B and the Band D when the low pass filter 11B and the high pass filter 12B are viewed from the common terminal 100 can be set to a normalizing impedance. Therefore, in the multiplexer 10B that executes CA of the first frequency band and the third frequency band, degradation in the insertion loss can be reduced even if a band to be selected changes.

In contrast, as illustrated in FIG. 13A, in the case of the CA mode 3 in which the Band A, the Band B, and the Band C are used at the same time, the switches SW11 and SW21 are in the non-conduction state, and the switches SW12, SW22, and SW3 are in the conduction state. The boundary frequency width between the Band A and the Band B is smaller than the boundary frequency width between the Band A and the Band C. Therefore, for CA of the Band A and the Band B, even if an overlapping frequency band in which the first transition band and the second transition band overlap is arranged in the boundary frequency band between the Band A and the Band B by the first frequency variable circuit and the second frequency variable circuit, insertion loss and demultiplexing characteristics in the two bands mentioned above degrade. Thus, the switches SW12, SW22, and SW3 of an impedance variable circuit 13B are in the conduction state. By causing the switches SW12 and SW22 to be in the conduction state, as illustrated in FIG. 13BA, the overlapping frequency band is arranged in the boundary frequency band between the Band B and the Band C, and, as illustrated in FIG. 13BB, a complex conjugate relationship of the impedance of the low pass filter 11B when the common terminal 100 side is viewed from the first terminal 110 and the impedance of the high pass filter 12B when the common terminal 100 side is viewed from the second terminal 120 can be achieved. More specifically, the impedance in the pass band, which is the Band A and the Band B, of the low pass filter 11B (for example, the Band 3 and the Band 1) when the common terminal 100 side is viewed from the first terminal 110 and the impedance of the pass band, which is the Band C, of the high pass filter 12B (for example, the Band 40) when the common terminal 100 side is viewed from the second terminal 120 have a complex conjugate relationship, and the impedance of the attenuation band, which is the Band C, of the low pass filter 11B (for example, the Band 40) when the common terminal 100 side is viewed from the first terminal 110 and the impedance in the attenuation band, which is the Band A and the Band B, of the high pass filter 12B (for example, the Band 3 and the Band 1) when the common terminal 100 side is viewed from the second terminal 120 have a complex conjugate relationship.

Accordingly, the impedance of the low pass filter 11B when the common terminal 100 side is viewed from the first terminal 110 and the impedance of the high pass filter 12B when the common terminal 100 side is viewed from the second terminal 120 have a complex conjugate relationship both in the pass band and the attenuation band. Thus, complex conjugate matching between the low pass filter 11B and the high pass filter 12B can be achieved with high accuracy.

Furthermore, by causing the switch SW3 to be in the conduction state, a combined impedance of the impedance of the low pass filter 11 and the impedance of the high pass filter 12, which have a complex conjugate relationship, can be matched to a normalizing impedance by the second impedance element. Thus, degradation in the insertion loss in the pass band of the radio frequency circuit 20 in the case where the Band A and the Band B are used at the same time can be reduced.

Figure 10B:
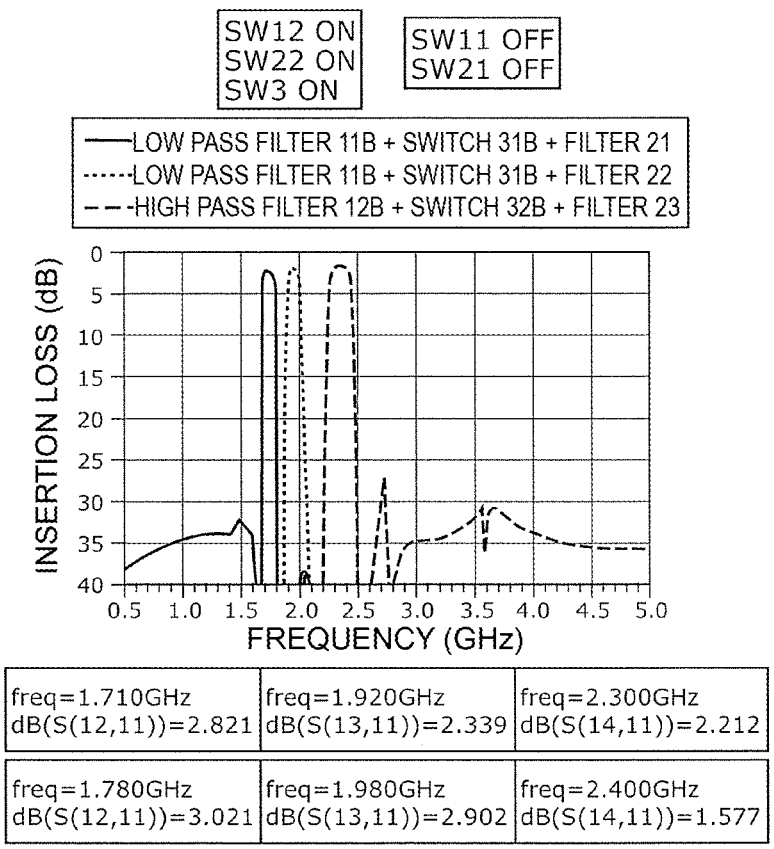
FIG. 10B is a graph indicating bandpass characteristics in 3CA of the radio frequency front end circuit according to the second embodiment.

FIG. 10B is a graph indicating bandpass characteristics in 3CA (v) of the radio frequency front end circuit 50 according to the second embodiment. In FIG. 10B, bandpass characteristics between the common terminal 100 and the output terminal of the filter 21 (the low pass filter 11B, the switch 31B, and the filter 21), bandpass characteristics between the common terminal 100 and the output terminal of the filter 22 (the low pass filter 11B, the switch 31B, and the filter 22), and bandpass characteristics between the common terminal 100 and the output terminal of the filter 23 (the high pass filter 12B, the switch 32B, and the filter 23) in (v) 3CA of the Band A, the Band B, and the Band C are illustrated.

In (vi) 3CA of the Band A, the Band B, and the Band C, as illustrated in FIG. 13A, the switches SW11 and SW21 are in the non-conduction state, and the switches SW12, SW22, and SW3 are in the conduction state.

Accordingly, as illustrated in FIG. 10B, the insertion loss in the Band A, the Band B, and the Band C of the radio frequency front end circuit 50B according to the second embodiment is reduced compared to the insertion loss in the Band A, the Band B, and the Band C of the radio frequency front end circuit 551 according to the Comparative Example 2 illustrated in FIG. 4BB.

Other Embodiments

Radio frequency circuits, radio frequency front end circuits, and communication apparatuses according to the present disclosure have been explained above with reference to embodiments, examples, and modifications. However, the present disclosure is not limited to the embodiments, the examples, the modifications explained above. Other embodiments implemented by combining components in the embodiments, the examples, and the modifications mentioned above, modifications obtained by making various changes conceived by those skilled in the art to the embodiments without necessarily departing from the scope of the present disclosure, and various types of equipment in which a radio frequency circuit, a radio frequency front end circuit, and a communication apparatus according to the present disclosure are built, are also encompassed in the present disclosure.

For example, in the first and second embodiments, LTE Band 3 is defined as the Band A (first pass band) and LTE Band 1 is defined as the Band B (third pass band). However, the Band A (first pass band) and the Band B (third pass band) are not necessarily applied to the Band 3 and the Band 1, respectively. The Band A (first pass band) may be any frequency range from among LTE Band 3, Band 4 (transmission band 1710 to 1755 MHz, reception band 2110 to 2150 MHz), 25 (transmission band 1850 to 1915 MHz, reception band 1930 to 1995 MHz), 39 (TDD band 1880 to 1920 MHz), 66 (transmission band 1710 to 1780 MHz, reception band 2110 to 2200 MHz), and Band 65 (transmission band 1920 to 2010 MHz, reception band 2110 to 2200 MHz). Furthermore, the Band B (third pass band) may be any frequency band from among LTE Band 1, 2 (transmission band 1850 to 1910 MHz, reception band 1930 to 1990 MHz), 4, 25, 34 (TDD band 2010 to 2025 MHz), 41 (TDD band 2496 to 2690 MHz), and 66.

In the embodiments, the examples, and the modifications described above, a configuration in which an impedance variable circuit is connected to both a high pass filter and a low pass filter has been exemplified. However, an impedance variable circuit may be connected to at least one of a high pass filter and a low pass filter.

Furthermore, in the embodiments, the examples, and the modifications described above, a high pass filter and a low pass filter are filters of a frequency variable type whose pass band and attenuation band are variable. However, a high pass filter and a low pass filter may be filters of a frequency fixed type.

Furthermore, in the embodiments, the examples, and the modifications described above, the first pass band (Band A), the third pass band (Band B), and the second pass band (Band C) are in ascending order of frequency. However, in the case where the first pass band (Band A), the third pass band (Band B), and the second pass band (Band C) are in descending order of frequency and CA of the first pass band (Band A) and the third pass band (Band B) is executed, complex conjugate matching may be used.

Furthermore, as multiplexers according to embodiments, examples, and modifications, a diplexer that performs division into a low band group and a high band group has been exemplified. However, the low band group and the high band group merely represent a band group of relatively low frequencies and a band group of relatively high frequencies, respectively.

Therefore, circuit configurations explained in the embodiments, the examples, and the modifications described above may be applied to a case where a combination of a low band group and a high band group includes any of two frequency band groups (may be the same frequency band group) from among (1) to (5).

(1) LB (699 to 960 MHz)
(2) MLB (1427 to 1511 MHz)
(3) MB (1710 to 2200 MHz)
(4) HB (2300 to 2690 MHz)
(5) UHB (3300 to 5000 MHz)

For example, the following combinations (A) to (D) are considered:

(A) LB/MB,
(B) MLB/MB,
(C) HB/UHB, and
(D) UHB/UHB.

Two or more frequency bands (bands) may belong to each frequency band group.

Furthermore, in the explanation provided above, an example of a diplexer that performs division into two frequency band groups has been explained as a multiplexer. However, division into three or more frequency band groups may be performed. For example, a multiplexer that performs division into LB, MLB, MB, and HB may be provided.

Furthermore, in the embodiments, the examples, and the modifications, a radio frequency front end circuit of a reception system has been exemplified. However, a radio frequency front end circuit of a transmission system or a radio frequency front end circuit that performs both transmission and reception may be provided.

Furthermore, for example, in a radio frequency circuit, a radio frequency front end circuit, and a communication apparatus according to an embodiment, a matching element such as an inductor and a capacitor and a switch circuit may be connected between components. The inductor may include a wiring inductor as wiring connecting components.

Furthermore, in multiplexers according to an embodiment, an example, and a modification, a configuration in which a high pass filter and a low pass filter each includes a parallel arm circuit (frequency variable circuit) is illustrated. However, a plurality of parallel arm circuits may be arranged. In accordance with this, three or more series arm circuits may be arranged. In the case where a plurality of parallel arm circuits and a plurality of series arm circuits are provided, the number of attenuation poles in filter bandpass characteristics can be increased. Therefore, for example, steepness characteristics of filter characteristics and flexibility in designing of an attenuation band can be increased.

INDUSTRIAL APPLICABILITY

The present disclosure is widely used for communication equipment such as cellular phones, as a radio frequency circuit, a radio frequency front end circuit, and a communication apparatus that are applicable to a multiband system that executes a CA mode.

REFERENCE SIGNS LIST 1 communication apparatus
2 antenna element
3 RF signal processing circuit (RFIC)
4 baseband signal processing circuit (BBIC)
10, 10A, 10B, 10C, 10D, 10E, and 510 multiplexer
11, 11A, 11B, 11C, 11D, 11E, 511, and 521 low pass filter
12, 12A, 12B, 12C, 12D, 12E, 512, and 522 high pass filter
13, 13A, 13B, 13C, 13D, and 13E impedance variable circuit
20, 20A, 20B, and 20C radio frequency circuit
21, 22, 23, and 24 filter
31, 31B, 31C, 32, 32A, 32B, 32C, 33, 531, 532, SW11, SW12, SW21, SW22, SW3, SW4, and SW5 switch
40H and 40L amplifying circuit
41, 42, 43, and 44 reception amplifier
50, 50A, 50B, 550, and 551 radio frequency front end circuit
100 common terminal
110 first terminal
120 second terminal
310, 320, 330, and 600 common terminal
311, 312, 321, 322, 323, 331, and 332 selection terminal
520 diplexer
610 and 620 input/output terminal
C11, C12, C13, C14, C15, C21, C22, C23, C24, C25, C30, and C40 capacitor
L11, L21, L22, L23, and L50 inductor

The invention claimed is:

1. A radio frequency circuit configured to transmit a first radio frequency signal in a first pass band and a second radio frequency signal in a second pass band at the same time, and configured to transmit the first radio frequency signal and a third radio frequency signal in a third pass band at the same time, the third pass band being between the first pass band and the second pass band, the radio frequency circuit comprising:
a common terminal;
a first terminal;
a second terminal;
a first filter configured to pass frequencies in the first pass band;
a second filter configured to pass frequencies in the second pass band;
a third filter configured to pass frequencies in the third pass band;
a diplexer comprising:
a low pass filter connected between the common terminal and the first terminal, and being configured to pass the first radio frequency signal and to attenuate the second radio frequency signal; and
a high pass filter connected between the common terminal and the second terminal, and being configured to pass the third radio frequency signal and to attenuate a fourth radio frequency signal in a fourth frequency band; and
a first impedance variable circuit that is connected to the low pass filter, the high pass filter, or both the low pass filter and the high pass filter,
wherein the first impedance variable circuit comprises:
a first impedance element; and
a first switch connected to the first impedance element,
wherein a boundary frequency width between the first pass band and the third pass band is less than a boundary frequency width between the first pass band and the second pass band,
wherein an overlapping frequency band is located between the first pass band and the third pass band, the overlapping frequency being an overlapping region of a first transition band and a second transition band, the first transition band being where the first frequency band transitions to the second frequency band, and the second transition band being where the third frequency band transitions to the fourth frequency band,
wherein when the first radio frequency signal and the third radio frequency signal are transmitted at the same time:
the first filter is connected to the first terminal or the second terminal,
the third filter is connected to the other of the first terminal or the second terminal, and
an impedance of the low pass filter when viewed toward the common terminal from the first terminal, and an impedance of the high pass filter when viewed toward the common terminal from the second terminal, have a complex conjugate relationship in accordance with a state of the first switch.

2. The radio frequency circuit according to claim 1,
wherein an impedance in the first pass band of the low pass filter when viewed toward the common terminal from the first terminal, and an impedance in the third pass band of the high pass filter when viewed toward the common terminal from the second terminal, have a complex conjugate relationship in accordance with the state of the first switch, and
an impedance in the third pass band of the low pass filter when viewed toward the common terminal from the first terminal, and an impedance in the first pass band of the high pass filter when viewed toward the common terminal from the second terminal, have a complex conjugate relationship in accordance with the state of the first switch.

3. The radio frequency circuit according to claim 1,
wherein when the first radio frequency signal and the third radio frequency signal are transmitted at the same time, the first switch is in a conductive state, and
wherein when the first radio frequency signal and the third radio frequency signal are transmitted exclusively from each other, the first switch is in a non-conductive state.

4. The radio frequency circuit according to claim 1,
wherein the low pass filter comprises:
an inductor connected in series in a first path, the first path connecting the common terminal to the first terminal; and
a first frequency variable circuit connected to the first path,
wherein the first frequency variable circuit comprises:
an LC series circuit comprising an inductor and a capacitor connected in series with each other; and
a second switch connected to the LC series circuit, and
wherein the first transition band is variable according to a state of the second switch.

5. The radio frequency circuit according to claim 4,
wherein the second switch is connected between ground and a connection node, the connection node being between the inductor and the capacitor of the first frequency variable circuit, and
wherein the first impedance element and the first switch are connected in series with each other, and are connected between the connection node and ground.

6. The radio frequency circuit according to claim 1,
wherein the high pass filter comprises:
a capacitor in series in a second path, the second path connecting the common terminal to the second terminal; and
a second frequency variable circuit connected to the second path,
wherein the second frequency variable circuit comprises:
an LC series circuit comprising an inductor and a capacitor connected in series with each other; and
a third switch connected to the LC series circuit, and
wherein the second transition band is variable according to a state of the third switch element.

7. The radio frequency circuit according to claim 6,
wherein the third switch is connected between ground and a connection node, the connection node being between the inductor and the capacitor of the second frequency variable circuit, and
wherein the first impedance element and the first switch are connected in series with each other, and are connected between the connection node and ground.

8. The radio frequency circuit according to claim 1,
wherein the first impedance variable circuit further comprises:
a second impedance element; and
a fourth switch,
wherein the second impedance element and the fourth switch are connected in series with each other, and are connected to the common terminal, the first terminal, or the second terminal, and
wherein when the first radio frequency signal and the third radio frequency signal are transmitted at the same time, the fourth switch is in a conductive state.

9. The radio frequency circuit according to claim 8, further comprising:
a first switch circuit comprising the first terminal and two or more selection terminals, the first switch circuit being configured to selectively connect the first terminal to the first filter or the third filter, the first terminal being a common terminal of the first switch circuit, and
a second switch circuit comprising the second terminal and two or more selection terminals, the second switch circuit being configured to selectively connect the second terminal to the second filter or the third filter, the second terminal being a common terminal of the second switch circuit,
wherein the first impedance element and the first switch are connected to each other, and are connected between the first terminal and ground, and
wherein the second impedance element and the fourth switch are connected to each other, and are connected between the second terminal and ground.

10. The radio frequency circuit according to claim 1,
wherein the first pass band is Long Term Evolution (LTE) Band 3, 4, 25, 39, or 66, and
wherein the third pass band is LTE Band 1, 2, 4, 25, 34, or 66.

11. A radio frequency front end circuit comprising:
the radio frequency circuit according to claim 1;
a first amplifying circuit connected to the first filter and to the third filter; and
a second amplifying circuit connected to the second filter.

12. A communication apparatus comprising:
a radio frequency (RF) signal processing circuit configured to process a radio frequency signal received by an antenna; and
the radio frequency front end circuit according to claim 11 configured to transmit the radio frequency signal between the antenna and the RF signal processing circuit.

* * * * *